United States Patent
Shigetoshi et al.

(10) Patent No.: US 10,930,516 B2
(45) Date of Patent: Feb. 23, 2021

(54) SEMICONDUCTOR DEVICE AND SEMICONDUCTOR DEVICE MANUFACTURING METHOD

(71) Applicant: SONY CORPORATION, Tokyo (JP)

(72) Inventors: Takushi Shigetoshi, Nagasaki (JP); Takanori Tada, Nagasaki (JP)

(73) Assignee: Sony Corporation, Tokyo (JP)

( * ) Notice: Subject to any disclaimer, the term of this patent is extended or adjusted under 35 U.S.C. 154(b) by 40 days.

(21) Appl. No.: 16/308,071

(22) PCT Filed: May 8, 2017

(86) PCT No.: PCT/JP2017/017327
§ 371 (c)(1),
(2) Date: Dec. 7, 2018

(87) PCT Pub. No.: WO2017/217132
PCT Pub. Date: Dec. 21, 2017

(65) Prior Publication Data
US 2019/0198337 A1    Jun. 27, 2019

(30) Foreign Application Priority Data
Jun. 15, 2016    (JP) .............................. JP2016-118730

(51) Int. Cl.
*H01L 21/3065*    (2006.01)
*H01L 23/522*    (2006.01)
(Continued)

(52) U.S. Cl.
CPC .... *H01L 21/3065* (2013.01); *H01L 21/31116* (2013.01); *H01L 21/31144* (2013.01);
(Continued)

(58) Field of Classification Search
None
See application file for complete search history.

(56) References Cited

U.S. PATENT DOCUMENTS 5,874,756 A * 2/1999 Ema ................... H01L 27/10873
                                                            257/296
6,096,598 A * 8/2000 Furukawa ............. G03F 7/0035
                                                            257/E21.027
(Continued)

FOREIGN PATENT DOCUMENTS

JP    2004-158538    6/2004
JP    2013-058525    3/2013
(Continued)

OTHER PUBLICATIONS

International Search Report prepared by the Japan Patent Office dated Jun. 27, 2017, for International Application No. PCT/JP2017/017327.

*Primary Examiner* — Allan W. Olsen
(74) *Attorney, Agent, or Firm* — Sheridan Ross P.C.

(57) ABSTRACT

The present invention aims to improve the accuracy and stability when removing an insulating film at a bottom of a TSV to allow a through hole to open toward a connection target electrode. A semiconductor device manufacturing method including: forming a through hole in a semiconductor substrate by using anisotropic etching performed from a first surface side of the semiconductor substrate; forming a thin film being an insulating film on an entire inner surface of the through hole; forming a carbon-containing thin film using plasma deposition on the first surface including an opening edge portion of the through hole; engraving an inner bottom of the through hole by using anisotropic plasma etching with the carbon-containing thin film as a mask; removing the carbon-containing thin film by ashing; and forming a through-substrate electrode in the through hole.

4 Claims, 28 Drawing Sheets

(51) Int. Cl.
*H01L 21/311* (2006.01)
*H01L 23/48* (2006.01)
*H01L 21/768* (2006.01)
*H01L 21/3205* (2006.01)
*H01L 21/3213* (2006.01)

(52) U.S. Cl.
CPC .... *H01L 21/3205* (2013.01); *H01L 21/32136* (2013.01); *H01L 21/768* (2013.01); *H01L 21/76802* (2013.01); *H01L 23/481* (2013.01); *H01L 23/522* (2013.01)

(56) References Cited

U.S. PATENT DOCUMENTS

| | | | | |
|---|---|---|---|---|
| 6,100,172 | A * | 8/2000 | Furukawa | H01L 21/0337 257/E21.038 |
| 6,251,798 | B1 * | 6/2001 | Soo | H01L 21/7682 257/E21.581 |
| 6,416,938 | B1 * | 7/2002 | Kubacki | C08J 7/123 216/62 |
| 6,764,812 | B1 * | 7/2004 | Kubacki | C08J 7/123 216/62 |
| 7,202,127 | B2 * | 4/2007 | Busch | H01L 27/10852 257/E21.019 |
| 7,785,962 | B2 * | 8/2010 | Bhat | H01L 28/91 257/E21.019 |
| 8,274,777 | B2 * | 9/2012 | Kiehlbauch | H01L 27/10817 361/301.1 |
| 9,716,033 | B2 * | 7/2017 | Enquist | H01L 21/76838 |
| 9,859,296 | B2 * | 1/2018 | Park | H01L 27/1157 |
| 2002/0022357 | A1 * | 2/2002 | Iijima | H01L 27/10855 438/622 |
| 2002/0153614 | A1 * | 10/2002 | Ema | H01L 21/76897 257/773 |
| 2004/0023367 | A1 * | 2/2004 | Xu | B01J 19/0046 435/287.2 |
| 2004/0110133 | A1 * | 6/2004 | Xu | B01J 19/0046 506/16 |
| 2008/0227035 | A1 * | 9/2008 | Kanri | B41J 2/1603 430/320 |
| 2011/0207323 | A1 | 8/2011 | Ditizio | |
| 2011/0208031 | A1 * | 8/2011 | Wolfe | A61B 5/0478 600/378 |
| 2014/0350375 | A1 * | 11/2014 | Wolfe | A61B 5/0084 600/377 |
| 2015/0097258 | A1 * | 4/2015 | Shigetoshi | H01L 27/14634 257/432 |
| 2016/0307908 | A1 * | 10/2016 | Sharangpani | H01L 27/11524 |
| 2018/0277874 | A1 * | 9/2018 | Matsuo | H01M 8/1213 |

FOREIGN PATENT DOCUMENTS

| | | |
|---|---|---|
| JP | 2013-520830 | 6/2013 |
| JP | 2015-119110 | 6/2015 |

* cited by examiner

SEMICONDUCTOR DEVICE AND SEMICONDUCTOR DEVICE MANUFACTURING METHOD

CROSS REFERENCE TO RELATED APPLICATIONS

This application is a national stage application under 35 U.S.C. 371 and claims the benefit of PCT Application No. PCT/JP2017/017327 having an international filing date of 08 May 2017, which designated the United States, which PCT application claimed the benefit of Japanese Patent Application No. 2016-118730 filed 15 Jun. 2016, the entire disclosures of each of which are incorporated herein by reference.

TECHNICAL FIELD

The present technology relates to a semiconductor device and a semiconductor device manufacturing method.

BACKGROUND ART

In recent years, the development of three-dimensional mounting technology using a through silicon via (TSV) is gaining momentum as a method to realize further enhanced functionality of semiconductor devices. Although the size of the current TSV has a width of several μm and an aspect ratio of about 10 or less, it is expected to achieve further downsized TSV with higher integration in order to achieve more signal transmission volume and smaller device size.

The formation of TSV is implemented by first forming a through hole penetrating a silicon substrate to reach a connection target electrode or its vicinity, forming an insulating film on a field portion and an inner surface of the through hole, removing the insulating film at the bottom of the through hole to allow the through hole to open toward the connection target electrode, and burying a barrier metal film and a metal inside the through hole to form a through-substrate electrode.

Here, Patent Documents 1 and 2 disclose technologies of removing the insulating film at the bottom of the TSV to allow the through hole to open toward the connection target electrode.

Patent Document 1 discloses that an insulating film provided on a field portion and an inner surface of a through hole is formed by using an insulating film with low coverage so that the insulating film on the inner surface near an upper portion of the through hole becomes thicker so as to form the through hole in an overhanging shape. This makes it possible to remove the insulating film alone at the bottom of the through hole while protecting the insulating film on the inner surface of the through hole.

In Patent Document 2, an insulating film provided on a field portion and an inner surface of a through hole is formed by using an insulating film with high coverage, and a resist film is formed above the field portion and the inner surface of the through hole from above the insulating film by a lithography method so that the width in the vicinity of the upper portion of the through hole becomes narrower than the width of the bottom of the through hole. This makes it possible to remove the insulating film alone at the bottom of the through hole while protecting the insulating film on the inner surface of the through hole.

CITATION LIST

Patent Document

Patent Document 1: Japanese Patent Application Laid-Open No. 2014-110287
Patent Document 2: Japanese Patent Application Laid-Open No. 2010-114201

SUMMARY OF THE INVENTION

Problems to be Solved by the Invention

The technique described in Patent Document 1 described above forms the insulating film inside the through hole so as to have an overhanging shape, leading to reduction of the opening width of the upper portion of the through hole due to compression by the insulating film. In enhancing the miniaturization of TSV compared to the current status, the reduction of the opening width of the through hole would have a greater influence on the processing difficulty degree. Especially when the aspect ratio of the through hole is 10 or more, the influence on the processing difficulty degree becomes extremely large. In addition, since the shape of the through hole is inversely tapered, it has also a great influence on the difficulty degree in burying the metal. On the other hand, in a case where the deposition amount of the insulating film with low coverage is reduced in order to avoid such influence, the upper insulating film might vanish before opening the bottom insulating film, causing the etching to reach the silicon substrate.

Furthermore, in the technology described in Patent Document 2 described above, enhancing the miniaturization of the TSV as compared with the current status might make the influence of the misalignment occurring at the time of mask alignment at the time of lithography noticeable, making it difficult to stably expose to the bottom of the hole, causing a processing accuracy problem.

The present technology has been made in view of the above problems and aims to improve the accuracy and stability when removing the insulating film at the bottom of the TSV to allow the through hole to open toward the connection target electrode.

Solutions to Problems

One aspect of the present technology is a semiconductor device manufacturing method including: a first step of forming a through hole in a semiconductor substrate by using anisotropic etching performed from a first surface side of the semiconductor substrate; a second step of forming a thin film being an insulating film on an entire inner surface of the through hole; a third step of forming a carbon-containing thin film using plasma deposition on the first surface including an opening edge portion of the through hole; a fourth step of engraving an inner bottom of the through hole by using anisotropic plasma etching with the carbon-containing thin film as a mask; a fifth step of removing the carbon-containing thin film by ashing, and a sixth step of forming a through-substrate electrode in the through hole.

Another aspect of the present technology is a semiconductor device including: a semiconductor substrate; a wiring layer formed to be stacked on a first surface of the semiconductor substrate; a metal film constituting a portion of the wiring layer; a first insulating film constituting a portion of the wiring layer and provided adjacent to the semiconductor substrate side of the metal film; a through-substrate electrode penetrating from the first surface of the semiconductor substrate and from a second surface of the semiconductor substrate opposite to the first surface, to the metal film; a second insulating film interposed between the through-substrate electrode and the semiconductor substrate; and a third insulating film formed to adhere to a second surface-side end portion of the second insulating film.

Note that the semiconductor device described above includes various aspects such as being implemented in a state of being incorporated in another device or being implemented together with other methods. Furthermore, the present technology can also be realized as a system including the semiconductor device. In addition, the above-described method of manufacturing a semiconductor device includes various aspects such as being implemented as a part of another manufacturing method.

Effects of the Invention

According to the present technology, it is possible to improve the accuracy and stability when removing the insulating film at the bottom of the TSV to allow the through hole to open toward the connection target electrode. Note that effects described in the present description are provided for purposes of exemplary illustration and are not intended to be limiting. Still other additional effects may also be contemplated.

MODE FOR CARRYING OUT THE INVENTION

Hereinafter, the present technology will be described in the following order.
(A) First embodiment:
(B) Second Embodiment:
(C) Third embodiment:
(D) Fourth Embodiment:
(E) Fifth embodiment:
(F) Sixth Embodiment:

(A) First Embodiment

Figure 1:
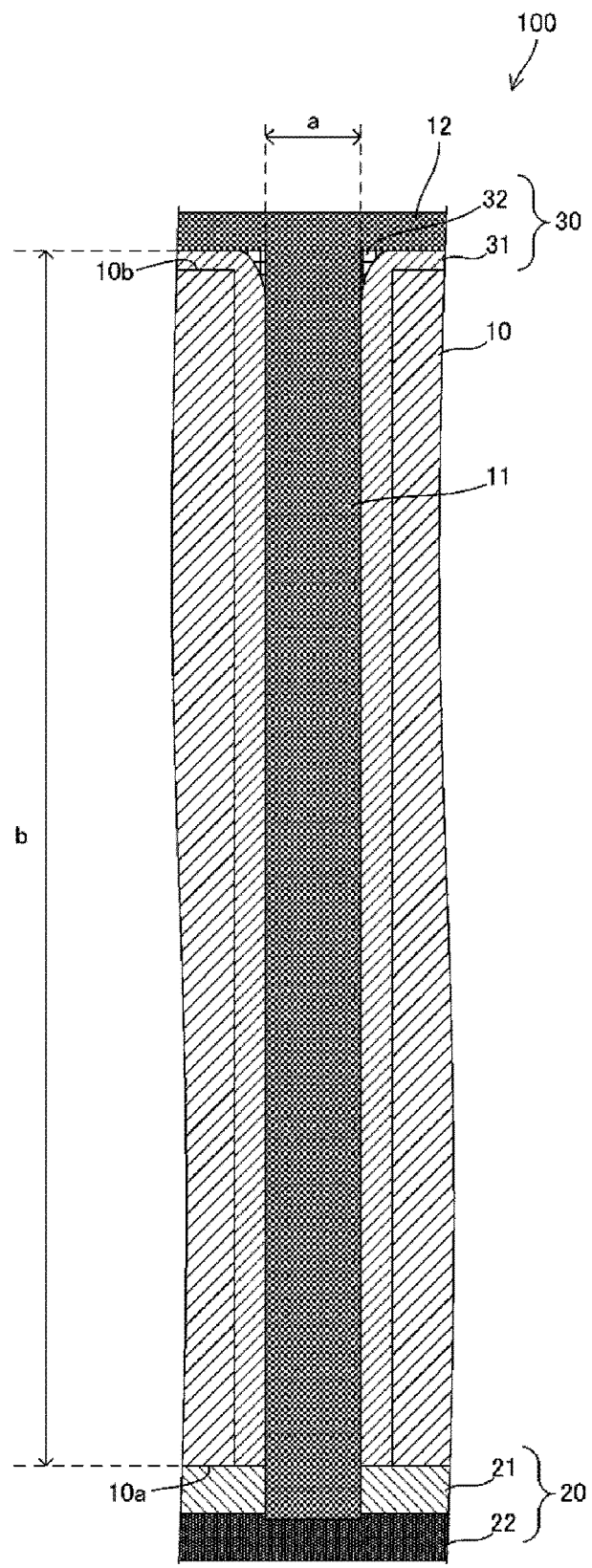
FIG. 1 is a diagram schematically illustrating a cross section of a main portion of a semiconductor device according to a first embodiment.

FIG. 1 is a diagram schematically illustrating a cross section of a main portion of a semiconductor device 100 according to the present embodiment.

The semiconductor device 100 has a configuration in which a wiring layer 20 including an insulating film, a metal film, a transistor element, or the like, is provided on a semiconductor substrate 10 such as a silicon substrate. FIG. 1 illustrates a state in which the wiring layer 20 is stacked on the semiconductor substrate 10 and thereafter the substrate is reversed, having the wiring layer 20 positioned below the semiconductor substrate 10. The thickness of the semiconductor substrate 10 is 1 μm to 10 μm, for example.

Note that in the following description of the surface of the semiconductor substrate 10, the surface on the lower side in FIG. 1 (side on which the wiring layer 20 is stacked) will be denoted as a front surface 10a, and the surface on the upper side in FIG. 1 as a back surface 10b in some cases.

Furthermore, a side on the wiring layer 20 closer to the semiconductor substrate 10 will be referred to as a lower side, and a side away from the semiconductor substrate 10 as an upper side.

The wiring layer 20 includes at least an insulating film 21 as a first insulating film and a metal film 22 (in FIG. 1, the insulating film 21 and the metal film 22 alone are illustrated), with the insulating film 21 being formed adjacent to a lower layer side of the metal film 22. The metal film 22 constitutes an electrode in the wiring layer 20.

A through hole 11 is formed in the semiconductor substrate 10. The through hole 11 has a form penetrating from the back surface 10b as a first surface of the semiconductor substrate 10 to the front surface 10a as a second surface on the opposite side thereof and further penetrating a layer below the metal film 22 in the wiring layer 20 to reach the metal film 22. The through hole 11 may partially include a hole formed in the metal film 22, and for example, may include a recess formed by etching or the like on the metal film 22 exposed at the bottom of the through hole 11.

On the semiconductor substrate 10, an insulating film 30 is continuously formed over the entire surface along the inner surface of the through hole 11 and the surface along the back surface 10b (at least in the vicinity of opening periphery of the through hole 11 of the back surface 10b) of the semiconductor substrate 10. The insulating film 30 is formed so as to cover the inner surface of the through hole 11 and the back surface 10b of the semiconductor substrate 10 with a substantially constant thickness and is interposed between a through-substrate electrode 12 formed in the through hole 11, and the semiconductor substrate 10. However, the insulating film 21 and the metal film 22 constituting the side surface and the bottom surface at the bottom of the through hole 11 of the semiconductor device 100 are not covered with the insulating film 30. The insulating film 30 is formed by using a low dielectric constant interlayer insulating film material (low-k material), and is formed by using, for example, at least one of $SiO_2$, SiN, SiON, SiOC, or SiOCH.

The through hole 11 has a size inside the insulating film 30, being 50 nm to 500 nm in an opening width a, and an aspect ratio (=b/a (b is the depth of the through hole 11)) of 10 or more. Since the through hole 11 is formed through the semiconductor substrate 10, the depth b of the through hole 11 is greater than the thickness of the semiconductor substrate 10, for example, the depth b is about 1 μm.

At least a portion of the vicinity of the opening of the through hole 11 of the insulating film 30 is constituted with an additional insulating film 32 as a third insulating film formed by a process different from the process for an insulating film main body 31 as a second insulating film constituting substantially the whole of the insulating film 30. In the insulating film 30 illustrated in FIG. 1, the additional insulating film 32 stacked on the insulating film main body 31 forms a corner of the opening of the through hole 11. The additional insulating film 32 may be formed not merely on the corner of the opening of the through hole 11 but also on the insulating film main body 31. The additional insulating film 32 is formed by using at least one of $SiO_2$, SiON, SiN, SiOC, or SiOCH.

In the insulating film 30, with the presence of the additional insulating film 32, it is possible to improve uniformity of the thickness of the insulating film 30 and the flatness of the front surface (side not facing the semiconductor substrate 10) as compared with the case of forming the insulating film 30 with the insulating film main body 31 alone.

The through-substrate electrode 12 (TSV) is buried inside the insulating film 30 formed along the inner surface of the through hole 11. The through-substrate electrode 12 includes a barrier metal film and a metal. The barrier metal film is formed by using at least one of Ti, TiN, Ta, or TaN. The metal is formed by using at least one of Cu, W, or Al.

The barrier metal film is a barrier film for preventing diffusion of metal and is continuously formed over an entire surface along the inner side of the insulating film 30 formed along the inner surface of the through hole 11 and the entire surface along the back surface 10b in the vicinity of the opening of the through hole 11. That is, a barrier metal film is formed to be interposed between the semiconductor substrate 10 and the metal.

FIGS. 2A-7B are diagrams schematically illustrating a method of manufacturing a main portion of the semiconductor device 100 described above.

The manufacturing method illustrated in these figures can be applied to manufacturing methods such as "Via Last TSV" and "Via after bondig", for example. "Via Last TSV" is a manufacturing method of first forming the wiring layer 20 on the semiconductor substrate 10 and thereafter forming a TSV to reach the wiring layer 20 from the back surface 10b side of the semiconductor substrate 10. The "Via after bondig" is a manufacturing method of first laminating and integrating two or more semiconductor substrates each having undergone wafer processing steps such as stacking of wiring layers, and then forming TSV to penetrate a depth of one semiconductor substrate or more from either the front or back side of the integrated substrate so as to reach another semiconductor substrate.

Figure 2A:
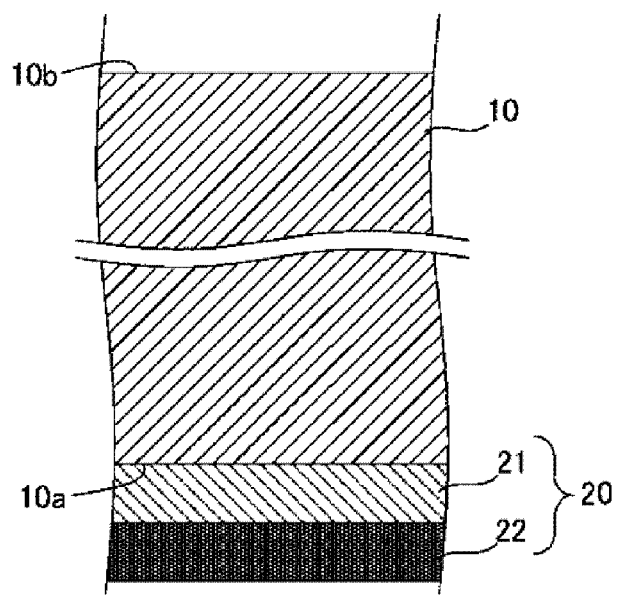
FIG. 2A is a diagram schematically illustrating a method of manufacturing a main portion of a semiconductor device according to a first embodiment.

First, the semiconductor substrate 10 on which the wiring layer 20 is stacked on the front surface 10a side of the semiconductor substrate 10 is prepared, and then, the semiconductor substrate 10 is mounted with its back surface 10b facing upwards, on a wafer stage of a semiconductor exposure apparatus for lithography (FIG. 2A).

Figure 2B:
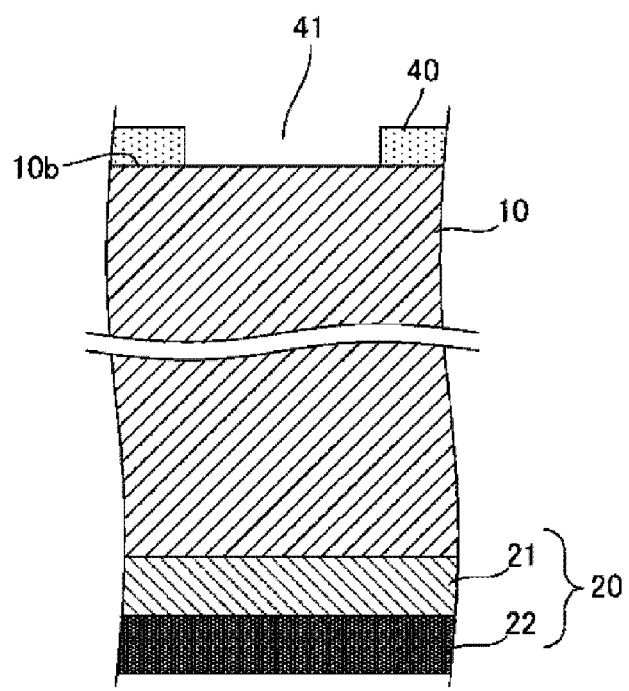
FIG. 2B is a diagram schematically illustrating a method of manufacturing a main portion of a semiconductor device according to the first embodiment.

Next, a resist 40 is formed on the back surface 10b of the semiconductor substrate 10 by using a photolithography technology FIG. 2B. The resist 40 has an opening 41 formed at a position where the through hole 11 is to be formed.

Figure 3A:
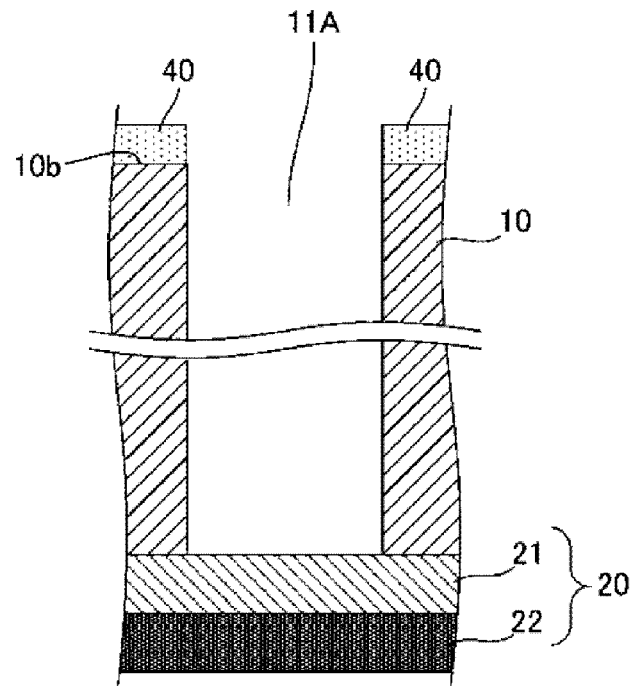
FIG. 3A is a diagram schematically illustrating a method for manufacturing a main portion of the semiconductor device according to the first embodiment.

Next, anisotropic plasma etching is performed on the resist 40 to form a through hole 11A (FIG. 3A). The through hole 11A formed in this step has a depth to reach the insulating film 21 from the back surface 10b of the semiconductor substrate 10, penetrating through the semiconductor substrate 10. Note that in this step, the insulating film 21 may be partially engraved by etching, and in this case, the through hole 11A is formed to a depth to reach a midway depth of the insulating film 21.

Figure 3B:
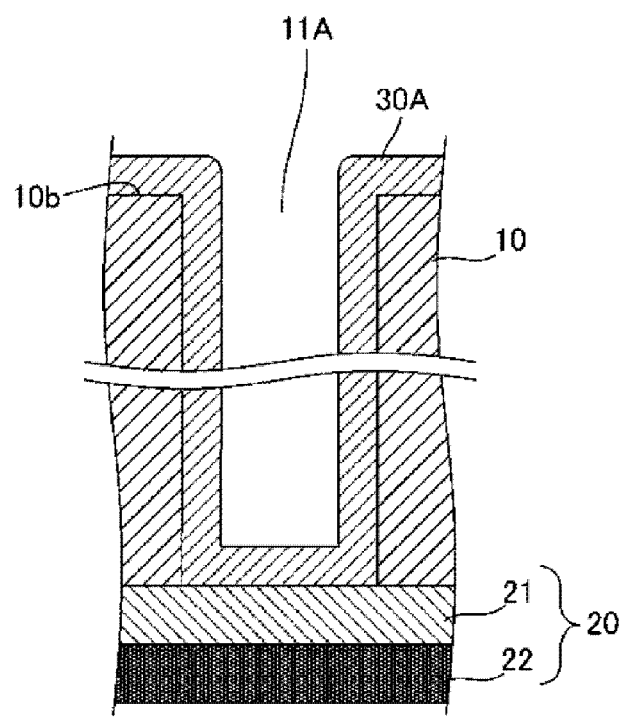
FIG. 3B is a diagram schematically illustrating a method for manufacturing a main portion of the semiconductor device according to the first embodiment.

Next, ashing is performed to remove the resist to form a high coverage insulating film 30A (not illustrated) over the entire surface along the inner surface (including the bottom surface) of the through hole 11A and along the back surface 10b of the semiconductor substrate 10 (at least vicinity of the opening of the through hole 11 of the back surface 10b) (FIG. 3B). The insulating film 30A is formed to cover the through hole 11 and the back surface 10b of the semiconductor substrate 10, with a substantially constant thickness. The insulating film 30A is formed by using at least one of SiO2, SiN, or SiON.

The insulating film 30A is formed by an atomic layer deposition (ALD) method, for example. Furthermore, the insulating film 30A can be formed by a thermal oxidation method, a low pressure chemical vapor deposition (LP-CVD) method, and a plasma-enhanced chemical vapor deposition (PE-CVD) method, for example.

The insulating film 30A formed by an ALD method is performed so as to form a film with high coverage by using an aminosilane-based precursor gas. The insulating film 30A formed by the LP-CVD method is formed by using SiH$_4$ or tetraethoxysilane (TEOS) as a precursor gas for SiO$_2$. In the case of SiN, SiH$_4$ or dichlorosilane (DCS) is used as a precursor gas. Note that formation of the insulating film 30A needs to be done before formation of the wiring layer 20 in a case where the LP-CVD method is used, since the LP-CVD method is high-temperature processing. In the formation of the insulating film 30A using the PE-CVD method, it is preferable to use organic silane as a precursor gas rather than SiH$_4$. In the case of SiO$_2$, it is possible to use TEOS, methylsilane (1MS), dimethylsilane (2MS), trimethylsilane (3MS), tetramethylsilane (4MS), or the like, as the precursor gas. In the case of SiN, Trisilylamine (TSA) can be used as the precursor gas. As a plasma source, PE-CVD by radial-line-slot antenna (RLSA) system has been reported as a high coverage method (Reference: Jpn. J. Appl. Phys. 48 (2009) 126001). SiOC and SiOCH are formed by the ALD method or the PE-CVD method. In this case, as the precursor gas, it is possible to use Bistrimethylsilylmethane (BTMSM), methyltrimethoxysilane (MTMS), tetramethylcyclotelrasiloxane (TMCTS), octamethylcyclotetrasiloxane (OMCTS), and Decamethylcyclopentasiloxane (DMCPS) in addition to the above 1MS, 2MS, 3MS, and 4MS. Note that in a case where the insulating film 30A is formed as a process after forming the wiring layer 20 as in the present embodiment, the insulating film 30A is formed in processing performed at a low temperature of less than 400° C.

Next, the bottom of the through hole 11A is engraved by etching to achieve a depth at which the metal film 22 is exposed at the bottom of the through hole 11A (FIGS. 4A to 5A and FIGS. 5B to 6B). As described below, the manufacturing method according to the present embodiment uses a technique of suppressing occurrence of a damage to the insulating film 30A other than the bottom of the through hole 11A by this etching.

Figure 4A:
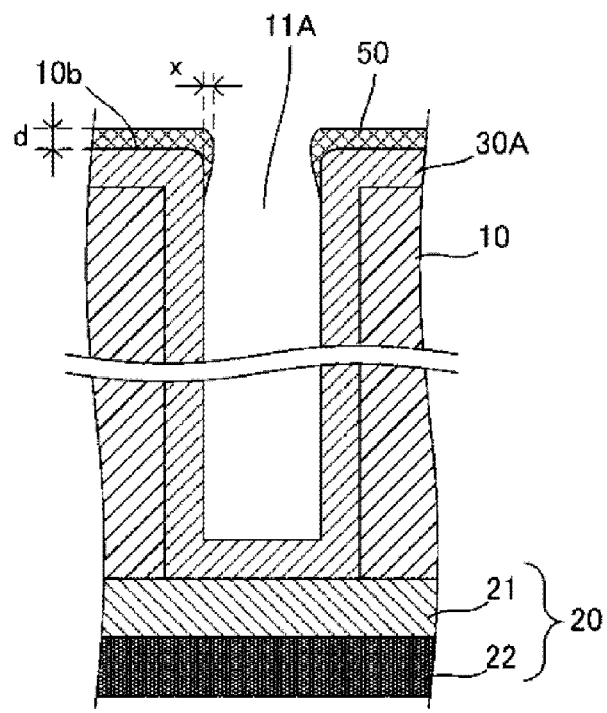
FIG. 4A is a diagram schematically illustrating a method of manufacturing a main portion of the semiconductor device according to the first embodiment.

First, a carbon-containing thin film 50 for protecting the insulating film 30A formed on the back surface 10b of the semiconductor substrate 10 is formed (FIG. 4A). It is possible to form the carbon-containing thin film 50 by using plasma having at least one of fluorocarbons CF4, C4F8, C4F6, etc.) or hydrofluorocarbons (CHF3, CH2F2, CH3F, C5HF7, etc.) as the process gas in a low ion energy state (for example, substrate bias of 100V or less).

The carbon-containing thin film 50 is formed as a thin film with low coverage. Therefore, as illustrated in FIG. 4A, while the carbon-containing thin film 50 adheres to the back surface 10b side of the semiconductor substrate 10 with a constant thickness or more, the formation of the film onto the inner surface of the through hole 11A is in such a degree that the film thickness gradually decreases toward the deeper portion of the through hole 11A in the vicinity of the opening of the through hole 11A (in the range of about several nm to several tens nm from the opening). The carbon-containing thin film 50 is formed with a thickness d of, for example, about 10 nm to 100 nm on the back surface 10b side of the semiconductor substrate 10.

The carbon-containing thin film 50 is formed in a shape protruding toward the center of the through hole 11A in the vicinity of the opening of the through hole 11A, and the film thickness gradually decreases toward the deeper portion of the through hole 11A as described above, leading to an overhanging shape of the carbon-containing thin film 50 in the vicinity of the opening of the through hole 11A. A protrusion amount x toward the center of the through hole 11A of the carbon-containing thin film 50 is about 3 nm in a case where the thickness d of the carbon-containing thin film 50 is about 10 nm to 100 nm. Therefore, when the through hole 11A has an opening width of about 50 nm on the inner side of the insulating film 30A, an opening width in a state where the carbon-containing thin film 50 has been formed would be about 43 nm.

Figure 4B:
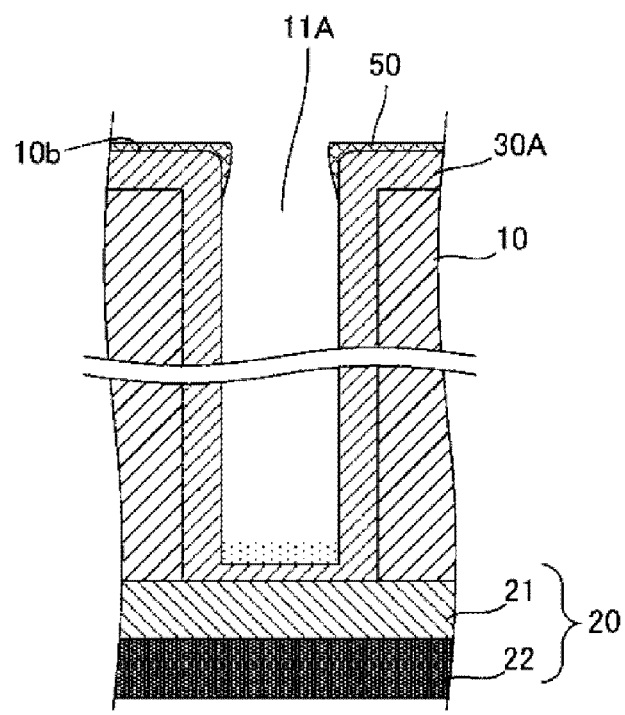
FIG. 4B is a diagram schematically illustrating a method of manufacturing a main portion of the semiconductor device according to the first embodiment.

Next, the bottom of the through hole 11A is engraved by anisotropic plasma etching using the carbon-containing thin film 50 as a mask (FIG. 4B). This anisotropic plasma etching uses plasma having at least one of fluorocarbons (CF4, C4F8, C4F6, etc.) or hydrofluorocarbons (CHF3, CH2F2, CH3F, C5HF7, etc.) as the process gas in a high ion energy state (for example, substrate bias of 500V or more). Note that the process gas may contain at least one of hydrocarbon (CH4, C2H4, etc.), He, Ar, O2, CO, or N2. At this time, the ratio of C in the gas chemistry is decreased compared with the case of forming the carbon-containing thin film 50 to prevent clogging of the opening of the through hole 11A due to excess polymer. Execution time for the anisotropic etching is set to a time that the carbon-containing thin film 50 formed on the back surface 10b of the semiconductor substrate 10 would not vanish due to the etching.

Figure 5A:
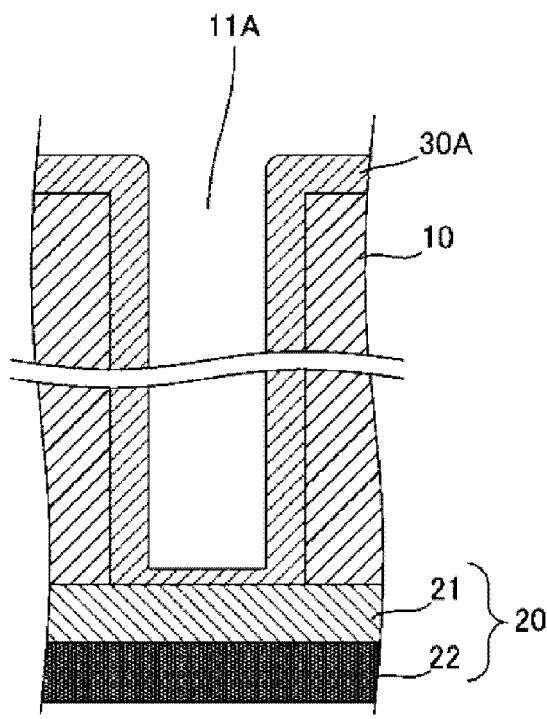
FIG. 5A is a diagram schematically illustrating a method of manufacturing a main portion of the semiconductor device according to the first embodiment.
Figure 5B:
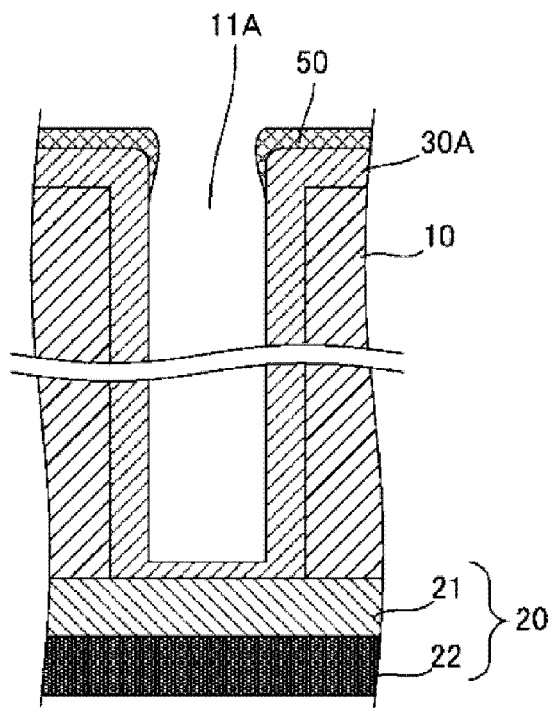
FIG. 5B is a diagram schematically illustrating a method of manufacturing a main portion of the semiconductor device according to the first embodiment.
Figure 6A:
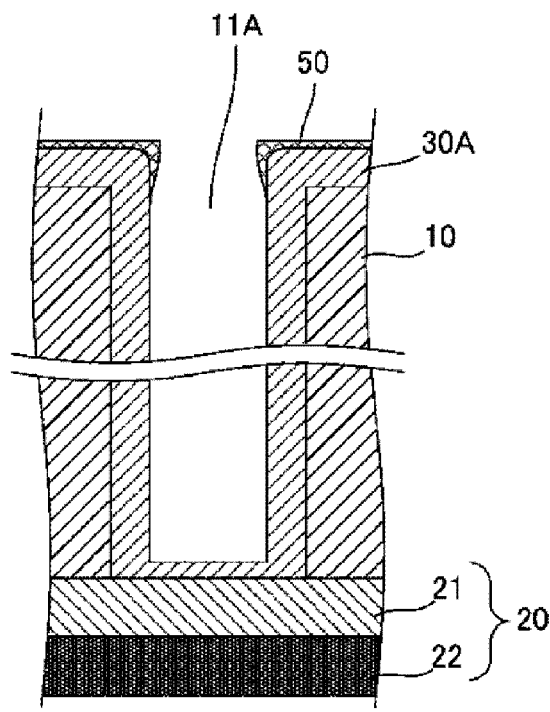
FIG. 6A is a diagram schematically illustrating a method of manufacturing a main portion of the semiconductor device according to the first embodiment.
Figure 6B:
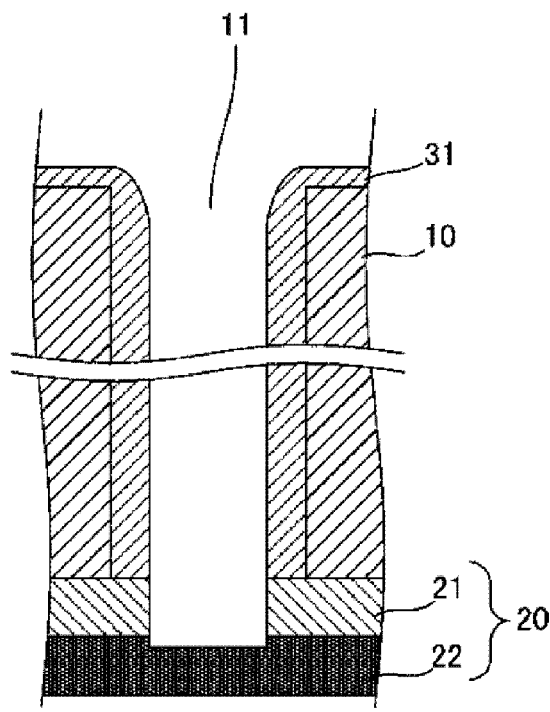
FIG. 6B is a diagram schematically illustrating a method of manufacturing a main portion of the semiconductor device according to the first embodiment.

Next, the carbon-containing thin film 50 is removed by ashing (FIG. 5A). This ashing is performed by plasma discharge including, for example, O2, H2, or N2 to remove the carbon-containing thin film 50 and remove C polymer adhered during the anisotropic plasma etching. The processing time may be set to a time period sufficient to remove the C polymer adhering to the inside of the carbon-containing thin film 50 and the through hole 11A.

Thereafter, processing of plasma deposition of the carbon-containing thin film 50 similar to FIGS. 4A to 5A, plasma etching using the carbon-containing thin film 50 as a mask, ashing of removing the carbon-containing thin film 50 and the C polymer adhered during etching (FIG. 5B to FIG. 6B) is repeatedly performed in a short cycle. In this manner, by repeating the plasma deposition, the plasma etching, and the ashing in a short cycle, it is possible to gradually engrave the bottom of the through hole 11A. This repetitive processing is performed until the bottom of the through hole 11A reaches the metal film 22 to form the through hole 11.

As described above, according to the present embodiment, the processing of the plasma deposition, the plasma etching, and the ashing is repeated in a short cycle to engrave the bottom of the through hole 11A to form the through hole 11. This makes it possible to eliminate the necessity of using a lithography technology and possible to complete processing within a same plasma apparatus.

Furthermore, since it is possible to reduce the thickness of the carbon-containing thin film 50 formed by each of plasma deposition processing, enabling decreasing the oppression of opening width of the through hole 11A by the carbon-containing thin film 50, leading to stabilized processing of the bottom of the through hole 11A. Furthermore, the carbon-containing thin film 50 can be easily removed, making it possible to minimize the influence on the subsequent process.

Note that there is no need to match processing times of plasma deposition, plasma etching, and ashing in each of cycles, and the processing time may be adjusted at each of cycles to adjust the film thickness and degree of coverage. Furthermore, it is allowable to perform a washing step of removing the processing residues deposited on the bottom of the through hole 11A during or after the repetitive processing described above.

Furthermore, there is a possibility that a damage occurring in the above-described repetitive processing causes reduction of the thickness of the insulating film 30 formed on the back surface 10b of the semiconductor substrate 10 (FIGS. 6B and 8A), scraping of the opening corner of the through hole 11A of the insulating film 30 formed on the back surface 10b of the semiconductor substrate 10 (FIGS. 6A and 8B), or roughening of the surface (FIG. 9A) of the insulating film 30 formed on the back surface 10b of the semiconductor substrate 10. In these cases, as illustrated in FIGS. 7A, 8A, 6A, 8B, and 9A, the low coverage additional insulating film 32 may be formed on the insulating film 30A as the insulating film main body 31 so as to compensate for roughness, decrease in film thickness, and rounding of the corner.

For example, $SiO_2$, SiN, or SiON may be used as the additional insulating film 32, and the film can be formed by a PE-CVD method using $SiH_4$, $Si_2H_6$, $Si_3H_8$, or TEOS as a precursor gas and using CCP or ICP plasma as a plasma source, for example. In the case of SiOC or SiOCH, the precursor gas same as that for the insulating film 30 can be used. The additional insulating film 32 is to be formed with a thickness (for example, about 10 nm to 100 nm) to such an extent that the amount of film formed on the bottom of the through hole 11 is extremely small. Alternatively, the additional insulating film 32 may be SiON or SiN.

Furthermore, the surface of the additional insulating film 32 may be flattened with chemical mechanical polishing (CMP) or the like to eliminate irregularities on the surface or uniformize the thickness of the insulating film 30.

Figure 9A:
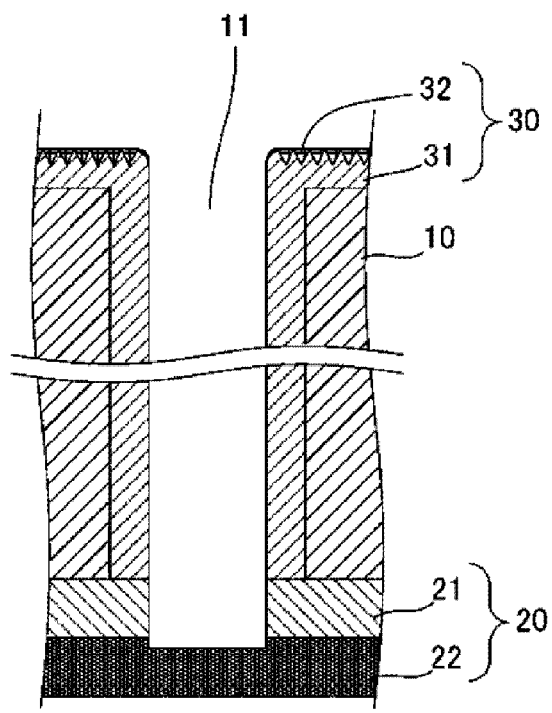
FIG. 9A is a diagram illustrating a shape of an additional insulating film.
Figure 9B:
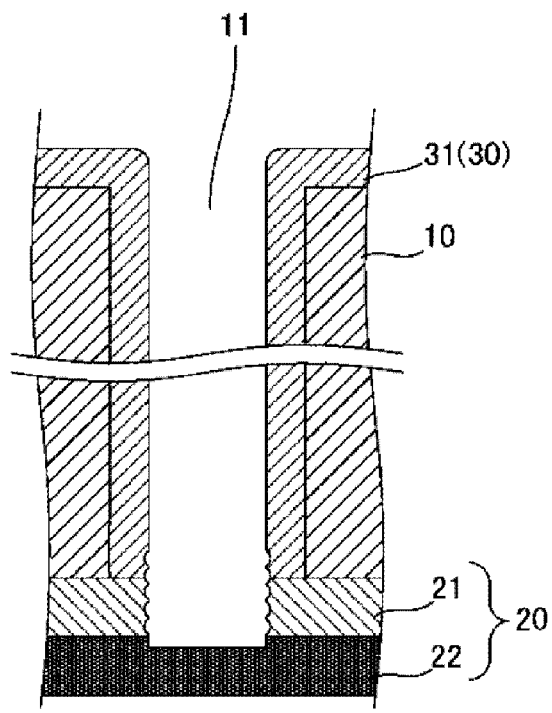
FIG. 9B is a diagram illustrating a shape of an additional insulating film.

In addition, as illustrated in FIG. 9B, there is a possibility that the damage occurring in the above-described repetitive processing causes formation of wave-like irregularities in a direction along a depth direction on the inner surface of the through hole 11A engraved by repetition of plasma deposition, plasma etching, and ashing, in a short cycle. In a case where the wave-like irregularities are left, a shape obtained by front/back inverting the wave-like irregularities is going to be formed in the structure of the bottom of the through-substrate electrode 12.

Figure 7A:
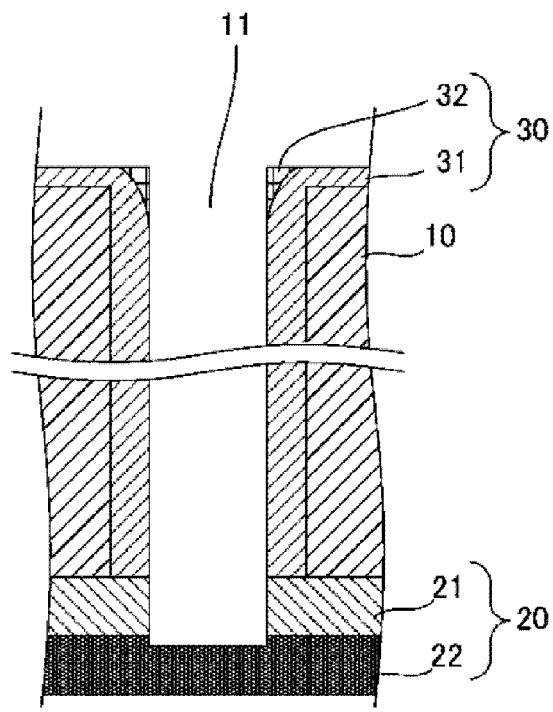
FIG. 7A is a diagram schematically illustrating a method of manufacturing a main portion of the semiconductor device according to the first embodiment.
Figure 7B:
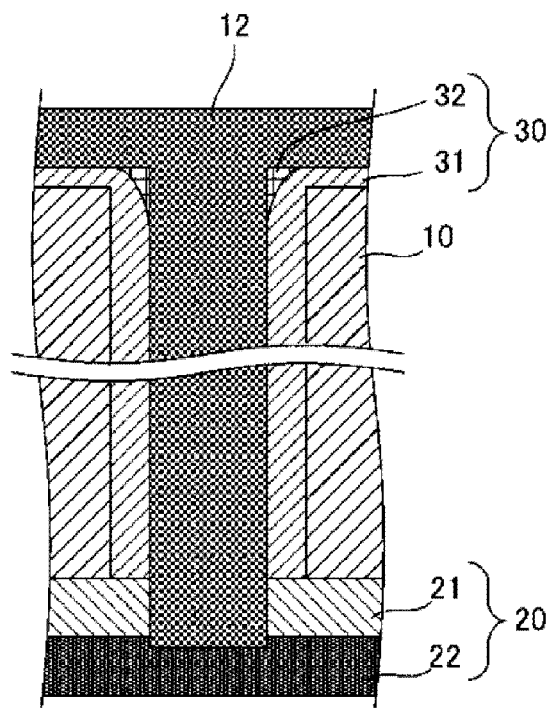
FIG. 7B is a diagram schematically illustrating a method of manufacturing a main portion of the semiconductor device according to the first embodiment.
Figure 8A:
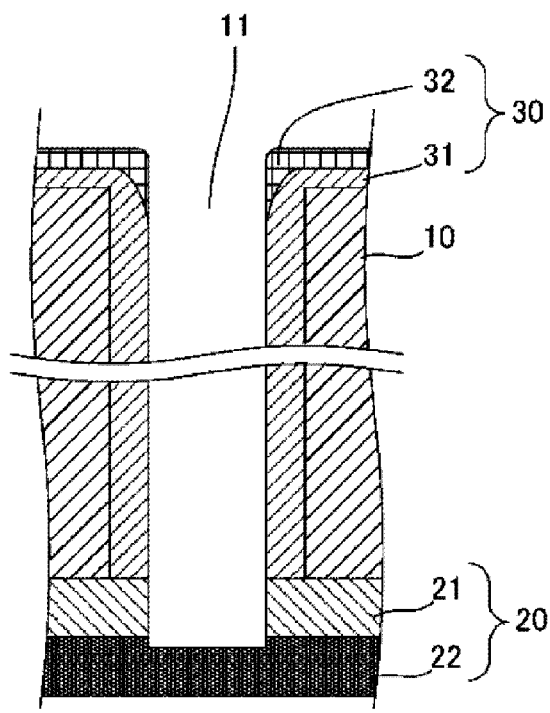
FIG. 8A is a diagram illustrating a shape of an additional insulating film.
Figure 8B:
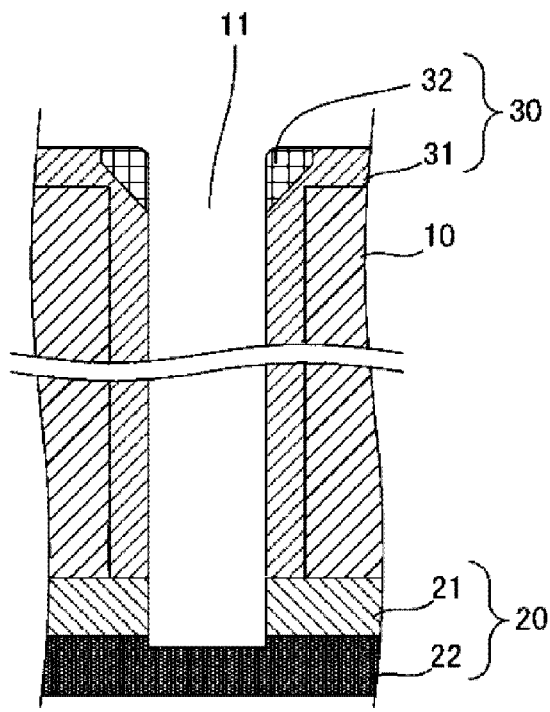
FIG. 8B is a diagram illustrating a shape of an additional insulating film.

Thereafter, a barrier metal film and a metal are buried in the through hole 11 (FIG. 7B). The barrier metal film is formed by using Ti, TiN, Ta, or TaN by a sputtering method, the ALD method, or the like. The metal is formed by using Cu, W, or Al, for example, by an electrolytic plating method.

Main portions of the semiconductor device 100 according to the present embodiment can be produced by using the manufacturing method described above.

(B) Second Embodiment

Next, a semiconductor device 200 according to a second embodiment and a method of manufacturing the same will be described. While the semiconductor device 200 is different from the above-described semiconductor device 100 in a manufacturing method, its shape and structure are substantially the same as those of the above-described semiconductor device 100, and thus, description of the shape and structure will be omitted. In addition, the reference signs of individual portions will also be denoted by the same reference signs as those of the semiconductor device 100.

FIGS. 10A-11B are diagrams schematically illustrating a method of manufacturing main portions of the semiconductor device 200 (the semiconductor device 200 itself is not illustrated). Note that FIGS. 10A-11B illustrate steps different from the manufacturing method of the semiconductor device 100 alone.

Steps before forming the through hole 11A and the step of forming the electrode within the through hole 11 in the semiconductor device 200 are similar to the steps in the method of manufacturing the semiconductor device 100 (FIGS. 2A and 2B, FIGS. 3A and 3B, and FIG. 7B).

In the present embodiment, an additional insulating film 32A is adhered to be formed beforehand on the insulating film 30A (FIG. 10A) in a period after formation of the through hole 11A and before formation of the carbon-containing thin film 50 and engraving of the bottom of the through hole 11A. That is, the low coverage additional insulating film 32A formed in a separate process from the insulating film 30A is formed so as to cover the insulating film 30A at least in the vicinity of the opening of the through hole 11A on the back surface 10b of the semiconductor substrate 10.

The additional insulating film 32A is formed by using at least one of $SiO_2$, SiON, or SiN. The manufacturing method is similar to the method for forming the additional insulating film 32 described in the first embodiment. For example, the film of $SiO_2$ is formed by using the PE-CVD method that uses $SiH_4$ or tetraethoxysilane (TEOS) as a precursor gas. The thickness of the additional insulating film 32A may be at a level that would not vanish during the etching or ashing performed at the engraving of the bottom of the through hole 11A, and at a level that would not damage the insulating film 30A (corresponding to the insulating film main body 31) during the etching or ashing performed at the engraving of the bottom of the through hole 11A.

Figure 10A:
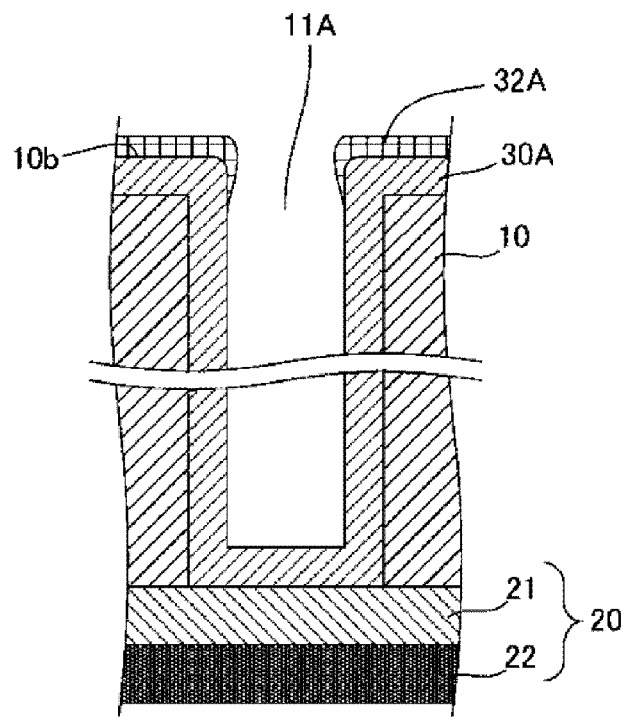
FIG. 10A is a diagram schematically illustrating a method of manufacturing a main portion of a semiconductor device according to a second embodiment.
Figure 10B:
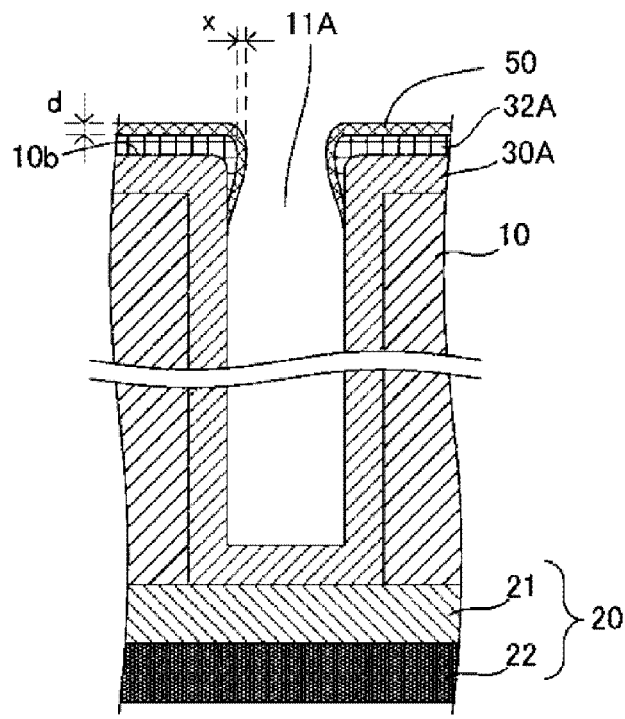
FIG. 10B is a diagram schematically illustrating a method of manufacturing a main portion of a semiconductor device according to the second embodiment.

The additional insulating film 32A is formed as a thin film with low coverage. Accordingly, as illustrated in FIG. 10B, the amount of adhesion formed on the back surface 10b of the semiconductor substrate 10 is large whereas the amount of adhesion to the inner surface of the through hole 11A is small. Therefore, the film thickness gradually decreases toward the deeper portion of the through hole 11A in the vicinity of the opening of the through hole 11A (in the range of several nm to several tens nm from the opening).

Next, the bottom of the through hole 11A is engraved by etching to achieve a depth at which the bottom of the hole reaches the metal film 22 (FIGS. 10B to 11B). The present embodiment also uses a technique of etching that suppresses occurrence of damage to the insulating film 30A other than the bottom of the through hole 11A.

First, a carbon-containing thin film 50 for protecting the additional insulating film 32A (particularly the additional insulating film 32A in the vicinity of the opening of the through hole 11A) formed along the back surface 10b of the semiconductor substrate 10 is formed (FIG. 10B). It is possible to form the carbon-containing thin film 50 by using plasma having at least one of fluorocarbons CF4, C4F8, C4F6, etc.) or hydrofluorocarbons (CHF3, CH2F2, CH3F, C5HF7, etc.) as the process gas in a low ion energy state (for example, substrate bias of 100V or less). Note that the process gas may contain at least one of hydrocarbon (CH4, C2H4, etc.), He, Ar, O2, CO, or N2.

The carbon-containing thin film 50 is formed as a thin film with low coverage. Therefore, as illustrated FIG. 10B, while the carbon-containing thin film 50 adheres to be formed on the back surface 10b side of the semiconductor substrate 10 with a constant thickness or more, the adhesion formation of the film onto the inner surface of the through hole 11A is in such a degree that the film thickness gradually decreases toward the deeper portion of the through hole 11A in the vicinity of the opening of the through hole 11A (in the range of about several nm to several tens nm from the opening). The carbon-containing thin film 50 is formed with a thickness of, for example, about 10 nm to 100 nm on the back surface 10b side of the semiconductor substrate 10.

The carbon-containing thin film 50 is formed in a shape protruding toward the center of the through hole 11A in the vicinity of the opening of the through hole 11A, and the film thickness gradually decreases toward the deeper portion of the through hole 11A as described above, leading to an overhanging shape of the carbon-containing thin film 50 in the vicinity of the opening of the through hole 11A. The protrusion amount x toward the center of the through hole 11A of the carbon-containing thin film 50 is about 3 nm in a case where the thickness d of the carbon-containing thin film 50 is about 10 nm to 100 nm. In the present embodiment, the additional insulating film 32A of low coverage is adhered to be formed beforehand on the insulating film 30A, and the additional insulating film 32A also has a shape protruding toward the center of the through hole 11A similarly to the carbon-containing thin film 50. Accordingly, assuming that the additional insulating film 32A has a protrusion amount of 3 nm, for example, the through hole 11A having an opening width of about 50 nm in a state where the insulating film 30A is adhered is going to have an opening with of about 37 nm in a state where the additional insulating film 32A and the carbon-containing thin film 50 are formed.

Figure 11A:
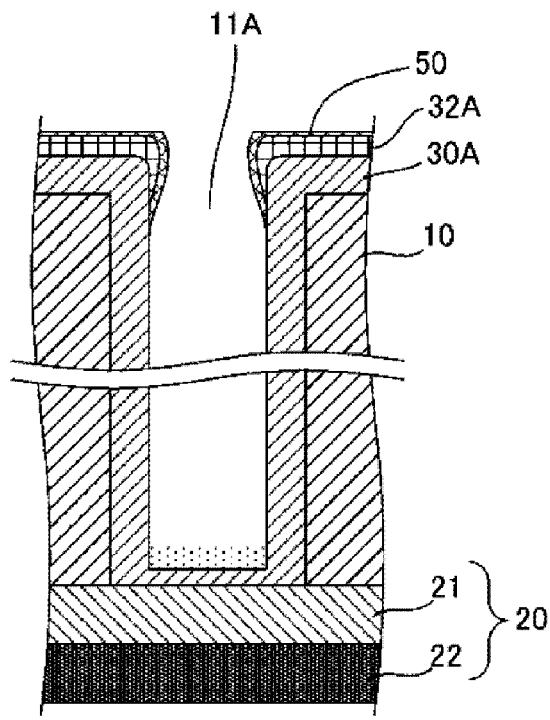
FIG. 11A is a diagram schematically illustrating a method of manufacturing a main portion of the semiconductor device according to the second embodiment.

The bottom of the through hole 11A having such an opening width is engraved by anisotropic plasma etching using the carbon-containing thin film 50 as a mask (FIG. 11A). This anisotropic plasma etching method is similar to the case of the first embodiment described above.

Figure 11B:
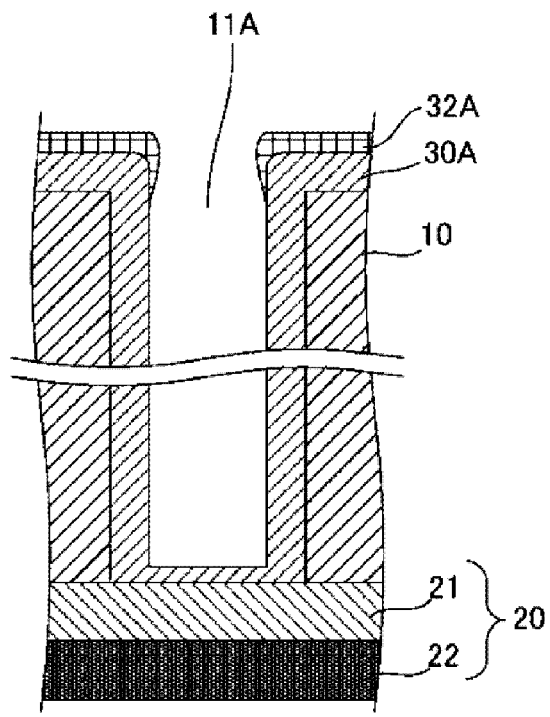
FIG. 11B is a diagram schematically illustrating a method of manufacturing a main portion of the semiconductor device according to the second embodiment.
Figure 12A:
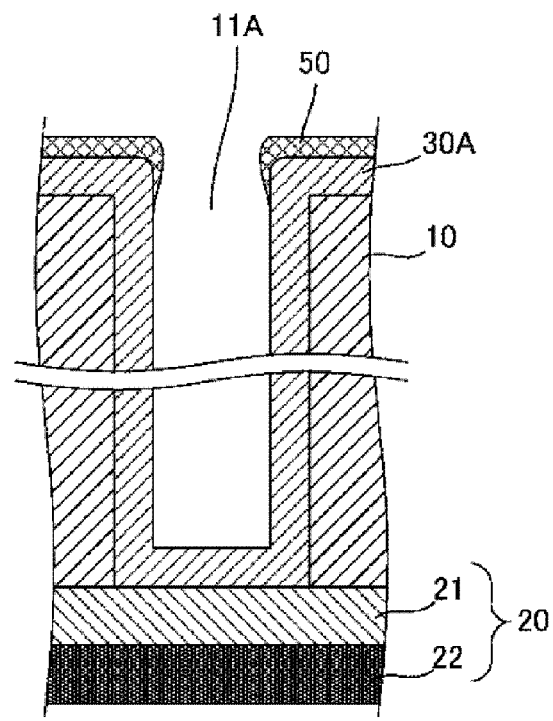
FIG. 12A is a diagram schematically illustrating a method of manufacturing a main portion of a semiconductor device according to a third embodiment.
Figure 12B:
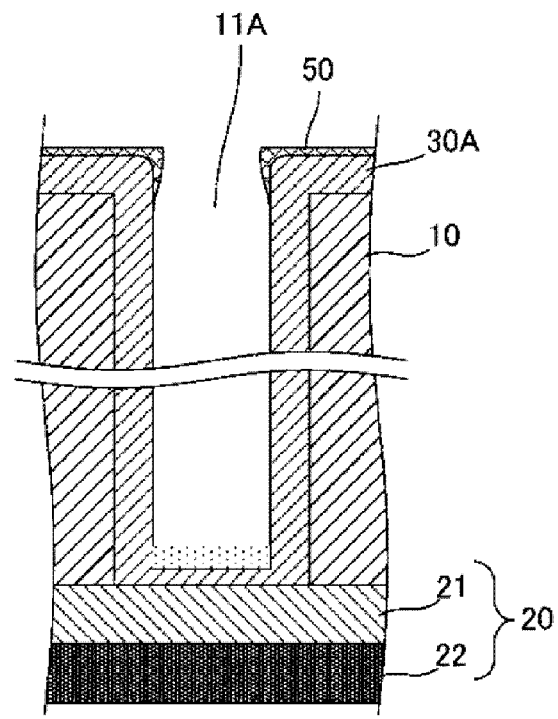
FIG. 12B is a diagram schematically illustrating a method of manufacturing a main portion of a semiconductor device according to the third embodiment.

Next, the carbon-containing thin film 50 and the C polymer adhered during the anisotropic plasma etching are removed by ashing (FIG. 11B). This ashing method is also similar to the case of the above-described first embodiment.

Thereafter, similarly to the first embodiment, processing of forming the carbon-containing thin film 50 by using plasma deposition again, plasma etching using the carbon-containing thin film 50 as a mask, and ashing of removing the carbon-containing thin film 50 and the C polymer adhered during etching is repeatedly performed in a short cycle so as to gradually engrave the bottom of the through hole 11A until the bottom of the through hole 11A reaches the metal film 22 to form the through hole 11.

Note that the additional insulating film 32A may be partially or entirely removed by a method such as CMP before burying the barrier metal and the metal, for example, or may be used as it is.

With the method of manufacturing the semiconductor device 200 according to the present embodiment described above, there is an advantage of being able to suppress the damage to the high coverage insulating film 30A initially formed to an extremely low level in addition to the advantages of the manufacturing method of the semiconductor device 100 according to the above-described first embodiment.

(C) Third Embodiment

Next, a semiconductor device 300 according to a third embodiment and a method of manufacturing the same will be described. While the semiconductor device 300 is different from the above-described semiconductor device 100 in a manufacturing method, its shape and structure are substantially the same as those of the above-described semiconductor device 100, and thus, description of the shape and structure will be omitted. In addition, the reference signs of individual portions will also be denoted by the same reference signs as those of the semiconductor device 100.

FIGS. 12A-13B are diagrams schematically illustrating a method of manufacturing main portions of the semiconductor device 300 (the semiconductor device 300 itself is not illustrated). Note that FIGS. 12A-13B illustrate steps different from the manufacturing method of the semiconductor device 100 alone.

Steps before forming the through hole 11A and the step of forming the electrode within the through hole 11 in the semiconductor device 300 are similar to the steps in the method of manufacturing the semiconductor device 100 (FIGS. 2A and 2B, FIGS. 3A and 3B, and FIG. 7B).

Furthermore, the present embodiment also performs processing, after the formation of the through hole 11A, of engraving the bottom of the through hole 11A by etching so as to achieve the depth at which the bottom of the through hole 11A reaches the metal film 22. The present embodiment also uses a technique of etching that suppresses occurrence of damage to the insulating film 30 other than the bottom of the through hole 11A.

Figure 13A:
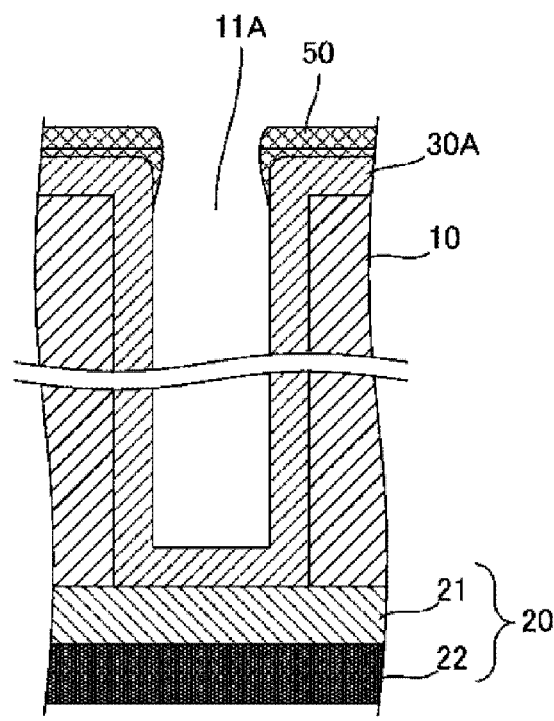
FIG. 13A is a diagram schematically illustrating a method of manufacturing a main portion of the semiconductor device according to the third embodiment.
Figure 13B:
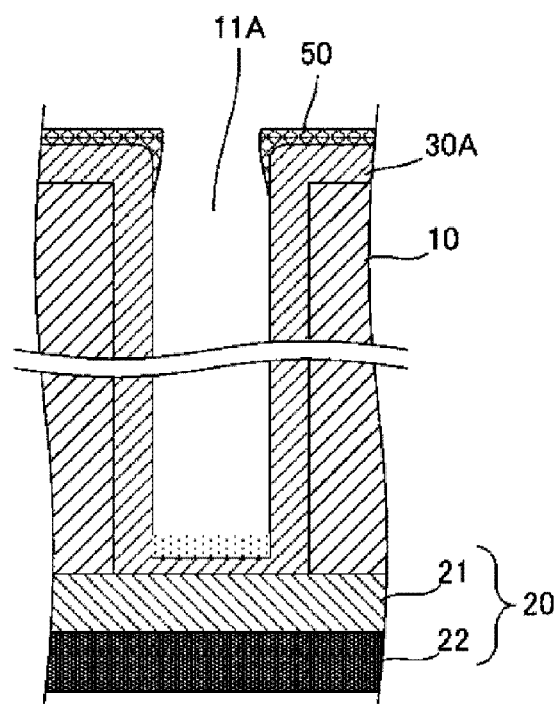
FIG. 13B is a diagram schematically illustrating a method of manufacturing a main portion of the semiconductor device according to the third embodiment.

However, this takes a configuration in which the step of repeatedly performing processing of: plasma deposition of the carbon-containing thin film 50 (FIG. 12A); the plasma etching using the carbon-containing thin film 50 as a mask (FIG. 12B); and ashing of removing the carbon-containing thin film 50 and the C polymer adhered during the etching in a short period is different from the above in that ashing is not performed every period but performed just after the plasma deposition and the plasma etching are repeated a plurality of times in a short cycle. That is, the configuration is different from the first embodiment in that ashing is not performed after the plasma deposition of the carbon-containing thin film 50 (FIG. 12A) and after the plasma etching using the carbon-containing thin film 50 as a mask (FIG. 12B), and that plasma deposition of stacking the carbon-containing thin film 50 further on the remaining carbon-containing thin film 50 (FIG. 13A), and that plasma etching using the carbon-containing thin film 50 remaining in the previous step and the carbon-containing thin film 50 stacked thereon as a mask (d)) is performed (FIG. 13B).

In this manner, the carbon-containing thin film 50 used as a mask while being stacked is completely removed by ashing once at a stage where the closure of the opening of the through hole 11A becomes unacceptable, and then, the carbon-containing thin film 50 is newly deposited on the insulating film 30A. In this manner, the bottom of the through hole 11A is gradually engraved while adding and updating the carbon-containing thin film 50 as a mask for plasma etching, the bottom of the through hole 11A reaches the metal film 22 to form the through hole 11. The steps after this processing are similar to the first embodiment described above.

With the manufacturing method according to the present embodiment described above, there is no need to perform ashing every time plasma etching is performed, making it possible to improve efficiency of the manufacturing steps.

(D) Fourth Embodiment

Next, a semiconductor device 400 according to a fourth embodiment and a method of manufacturing the same will be described. After forming the wiring layer 420 on a semiconductor substrate 410, the semiconductor device 400 forms, as an example, a through-substrate electrode 412 penetrating through the wiring layer 420 from a back surface 410*b* side of the semiconductor substrate 410 to reach a metal electrode pad 460 provided near a front surface 410*a*.

Figure 14:
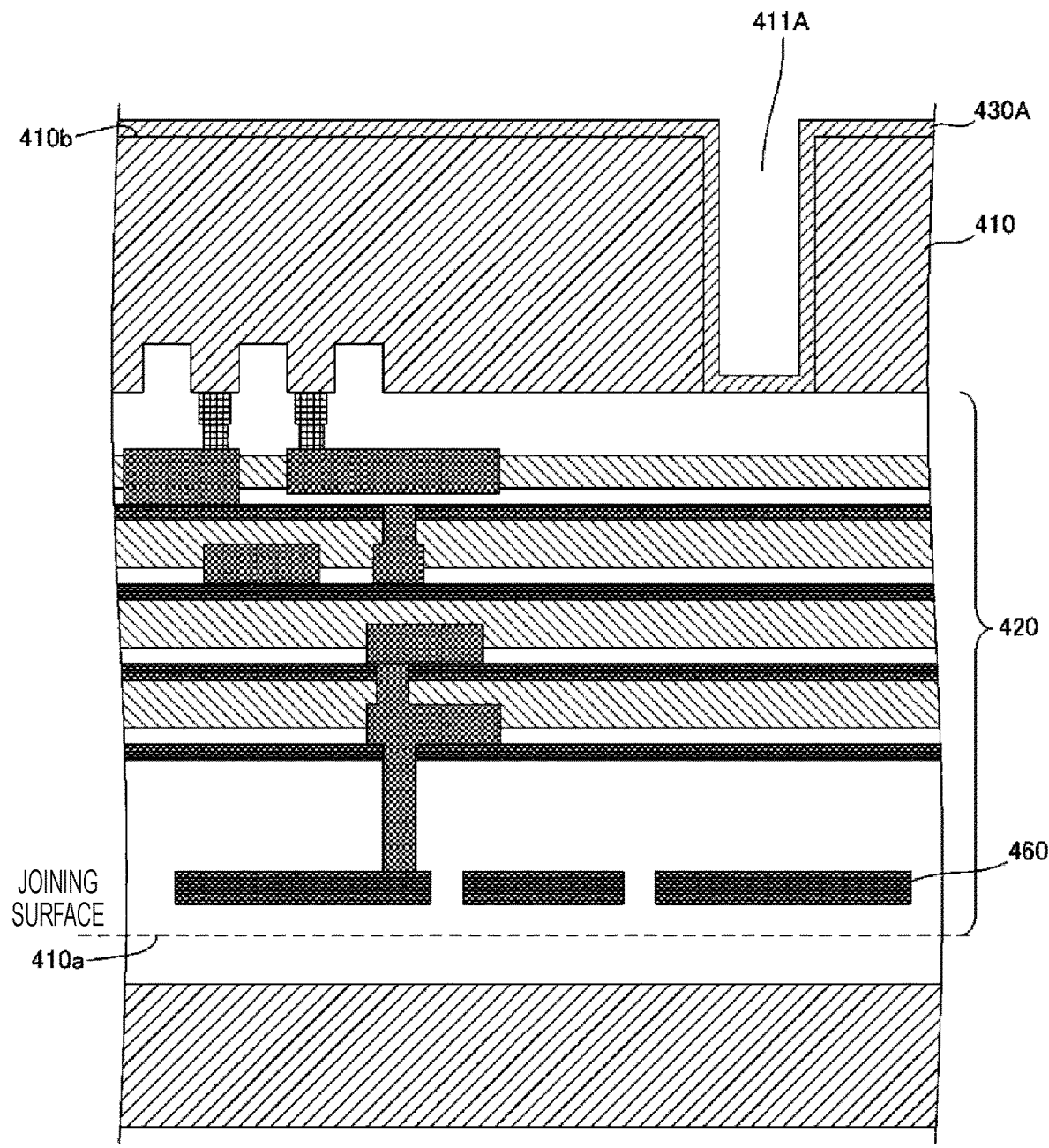
FIG. 14 is a diagram schematically illustrating a method of manufacturing a main portion of a semiconductor device according to a fourth embodiment.
Figure 15:
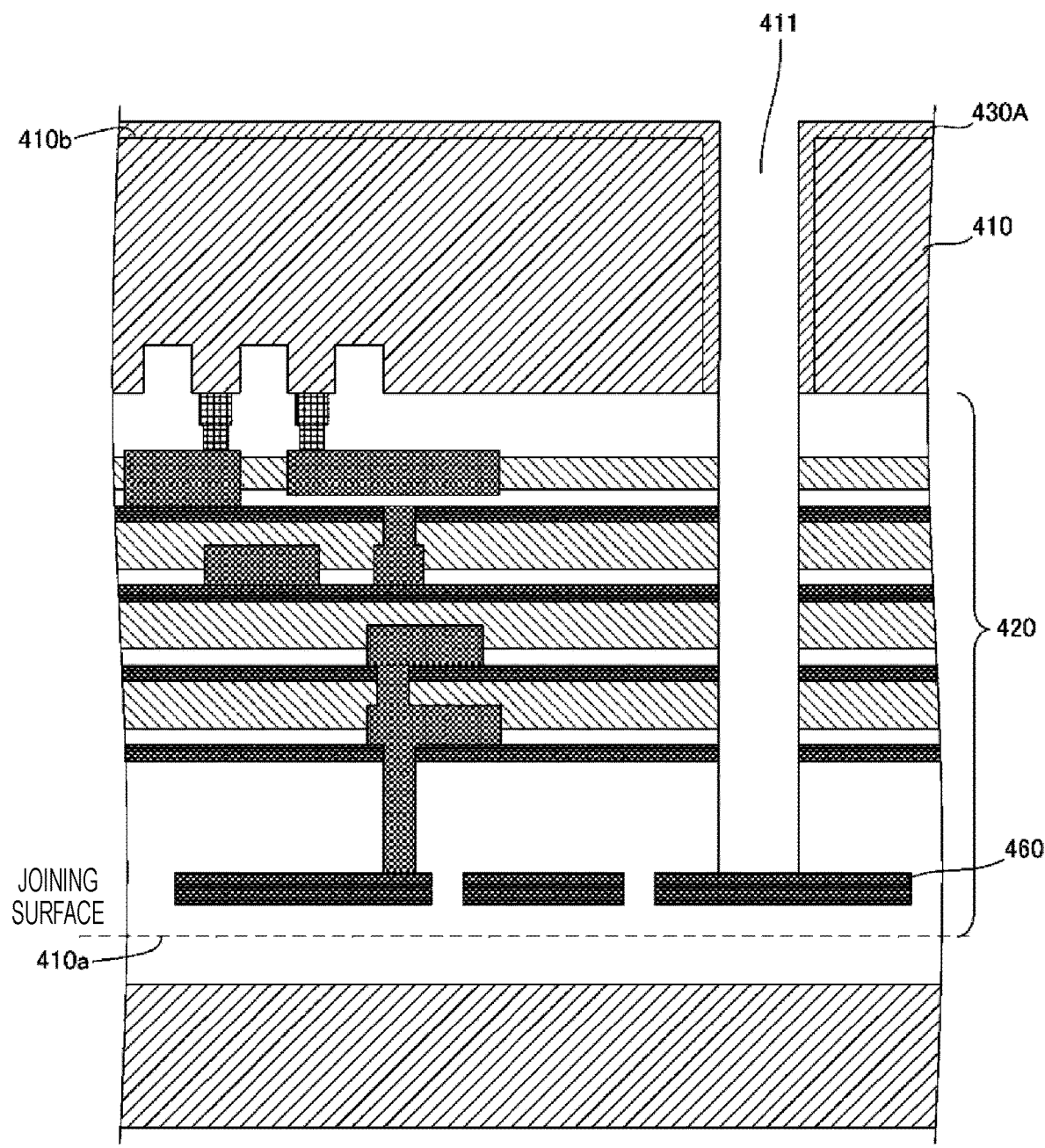
FIG. 15 is a diagram schematically illustrating a method of manufacturing a main portion of the semiconductor device according to the fourth embodiment.
Figure 16:
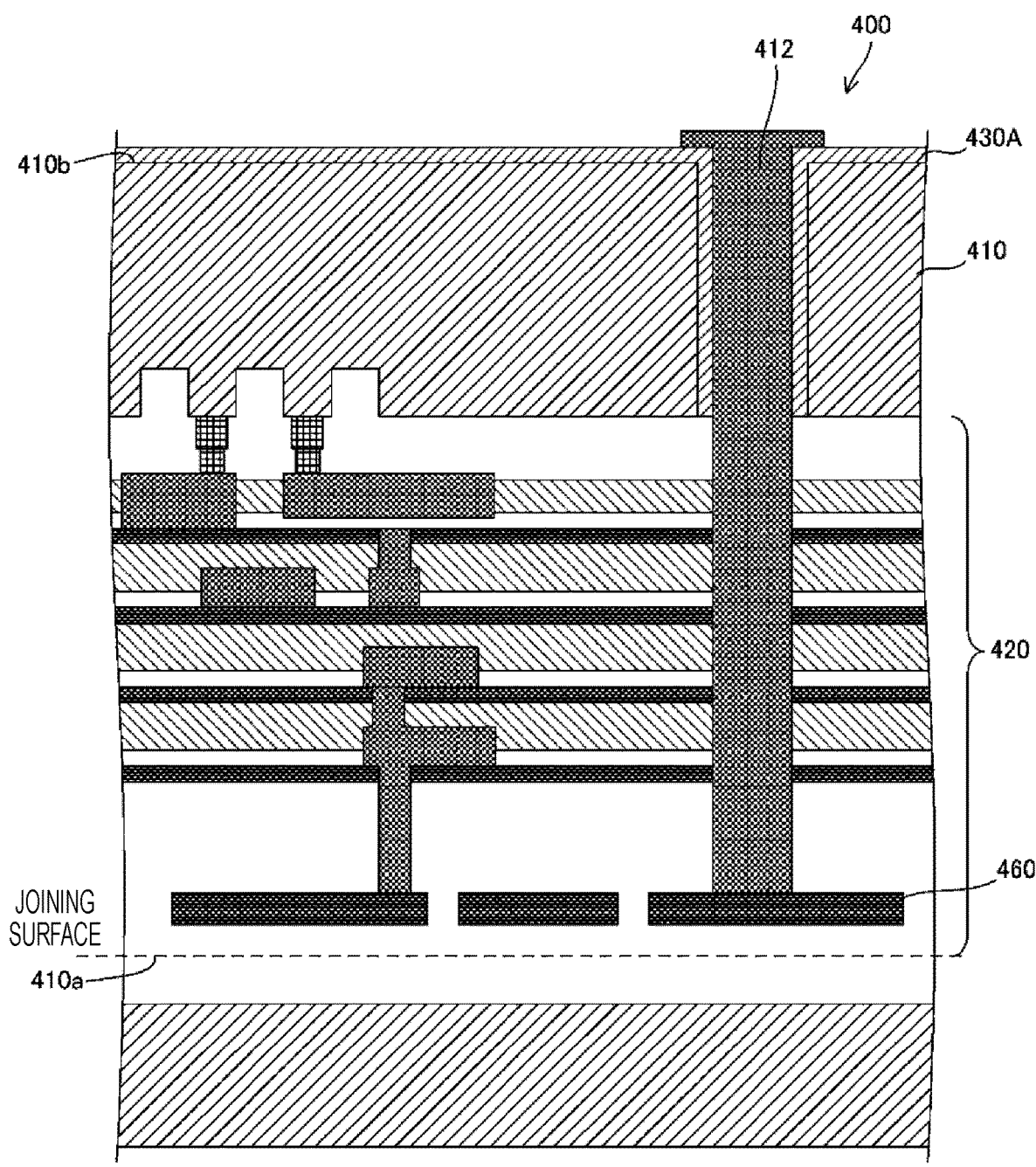
FIG. 16 is a diagram schematically illustrating a method of manufacturing a main portion of the semiconductor device according to the fourth embodiment.

FIGS. 14 to 16 are diagrams schematically illustrating a method of manufacturing main portions of the semiconductor device 400 according to the present embodiment.

As illustrated in FIG. 14, the method of manufacturing the semiconductor device 400 includes: first forming a through hole 411A to penetrate the semiconductor substrate 410; and stacking an insulating film 430A over the entire surface including the back surface 410*b* of the semiconductor substrate 410 and an inner surface of the through hole 411A. The semiconductor substrate 410, the through hole 411A, and the insulating film 430A respectively correspond to the semiconductor substrate 10, the through hole 11A, and the insulating film 30A of the first embodiment.

Thereafter, similarly to the engraving of the bottom of the through hole 11A in the first embodiment, the bottom of the through hole 411A is engraved by processing of plasma deposition, plasma etching, and ashing repeatedly performed in a short cycle, so as to form a through hole 411 that penetrates through the wiring layer 420 to reach the metal electrode pad 460 (FIG. 15). The through hole 411 is a configuration corresponding to the through hole 11 of the first embodiment. Note that at engraving the wiring layer 420, etching is performed while appropriately changing etching conditions in accordance with individual film types of the stacked film constituting the wiring layer 420.

For the through hole 411 thus formed, similarly to the through hole 11 of the first embodiment, a through-substrate electrode 412 (TSV) is formed by burying a barrier metal film and a metal (not illustrated) into the through hole 411 (FIG. 16).

In this manner, with the manufacturing method of the semiconductor device 400 according to the present embodiment, the through hole 411 penetrating the wiring layer 420 can be formed by the processing performed in the same plasma device, making it possible to eliminate the necessity of using a lithography technology in the processing of engraving the bottom of the through hole 411A to penetrate the wiring layer 420. In addition, processing of the bottom of the through hole 411A is stabilized. Furthermore, since the carbon-containing thin film 50 is easy to remove, the influence on the subsequent process can be minimized.

(E) Fifth Embodiment

Next, a semiconductor device 500 according to a fifth embodiment and a method of manufacturing the same will be described. The semiconductor device 500 is formed by stacking lamination of a plurality of elements including a wiring layer or the like on a semiconductor substrate. This example includes: a through-substrate electrode penetrating at least one element to be connected to an electrode of another element; and a through-substrate electrode penetrating solely the semiconductor substrate of the same single element to be connected to an electrode in the wiring layer within the same element.

FIGS. 17 to 20 are diagrams schematically illustrating a method of manufacturing a main portion of the semiconductor device 500 according to the present embodiment.

As illustrated in FIGS. 17 to 20, the semiconductor device 500 is formed by adding processing to be described later to a combination obtained by joining a first element X and a second element Y by lamination. In the first element X, a wiring layer 520X is formed on a semiconductor substrate 510X. In the second element Y, a wiring layer 520Y is formed on a semiconductor substrate 510Y. The first element X and the second element Y are joined with each other by lamination with the wiring layer 520X side and the wiring layer 520Y side facing each other.

Hereinafter, a boundary between the first element X and the second element Y will be referred to as a joining surface Z.

Accordingly, in the semiconductor device 500, the wiring layer 520X is located at a position more toward the joining surface Z than the semiconductor substrate 510X within the first element X, while the wiring layer 520Y is located at a position more toward the joining surface Z than the semiconductor substrate 510Y within the second element Y.

Figure 17:
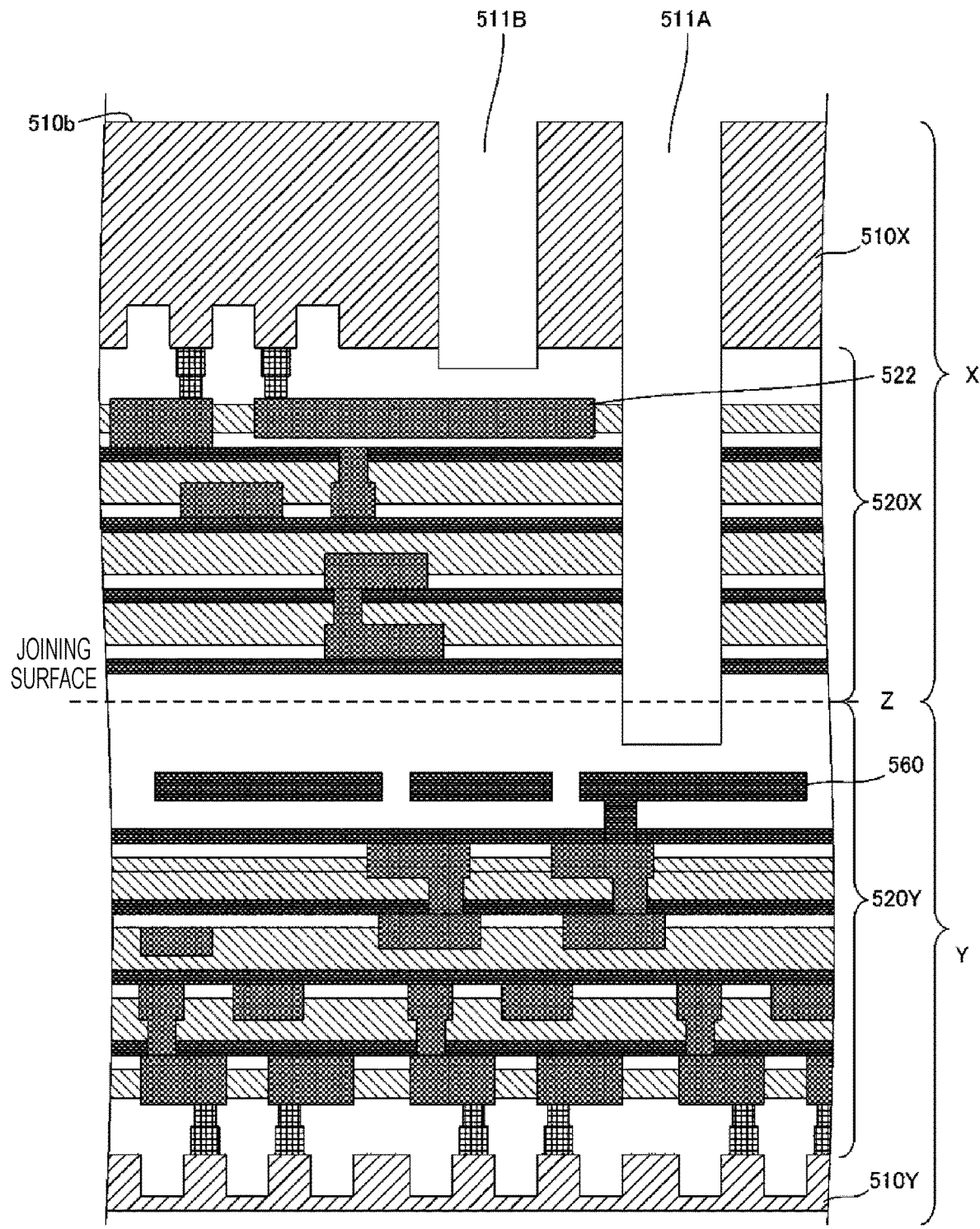
FIG. 17 is a diagram schematically illustrating a method for manufacturing a main portion of a semiconductor device according to a fifth embodiment.

As illustrated in FIG. 17, a through hole 511A and a through hole 511B are formed (FIG. 17) as a first step of the method of manufacturing the semiconductor device 500. The through hole 511A is formed to penetrate through the semiconductor substrate 510X from the back surface 11*b* and having a depth not reaching the metal film 522 as a connection target of the wiring layer 520X of the first element X. The through hole 511B is formed to go beyond the joining surface Z from the back surface 510b to reach the second element Y and having a depth not reaching a metal electrode pad 560 formed in the wiring layer 520Y of the second element Y.

The through hole 511A and the through hole 511B are formed by a method similar to the method for forming the through hole 11A of the above-described first embodiment. For example, etching is performed after resist formation on the opening of the forming range of the through hole 511A and on the back surface 510b so as to form the through hole 511A, and thereafter, the resist is removed once. Next, while burying the resist in the formed through hole 511A for protection, etching is performed after resist formation on the opening of the forming range of the through hole 511B and on the back surface 510b so as to form the through hole 511B, and thereafter, the resist is removed. With this processing, the through hole 511A and the through hole 511B are formed.

Figure 18:
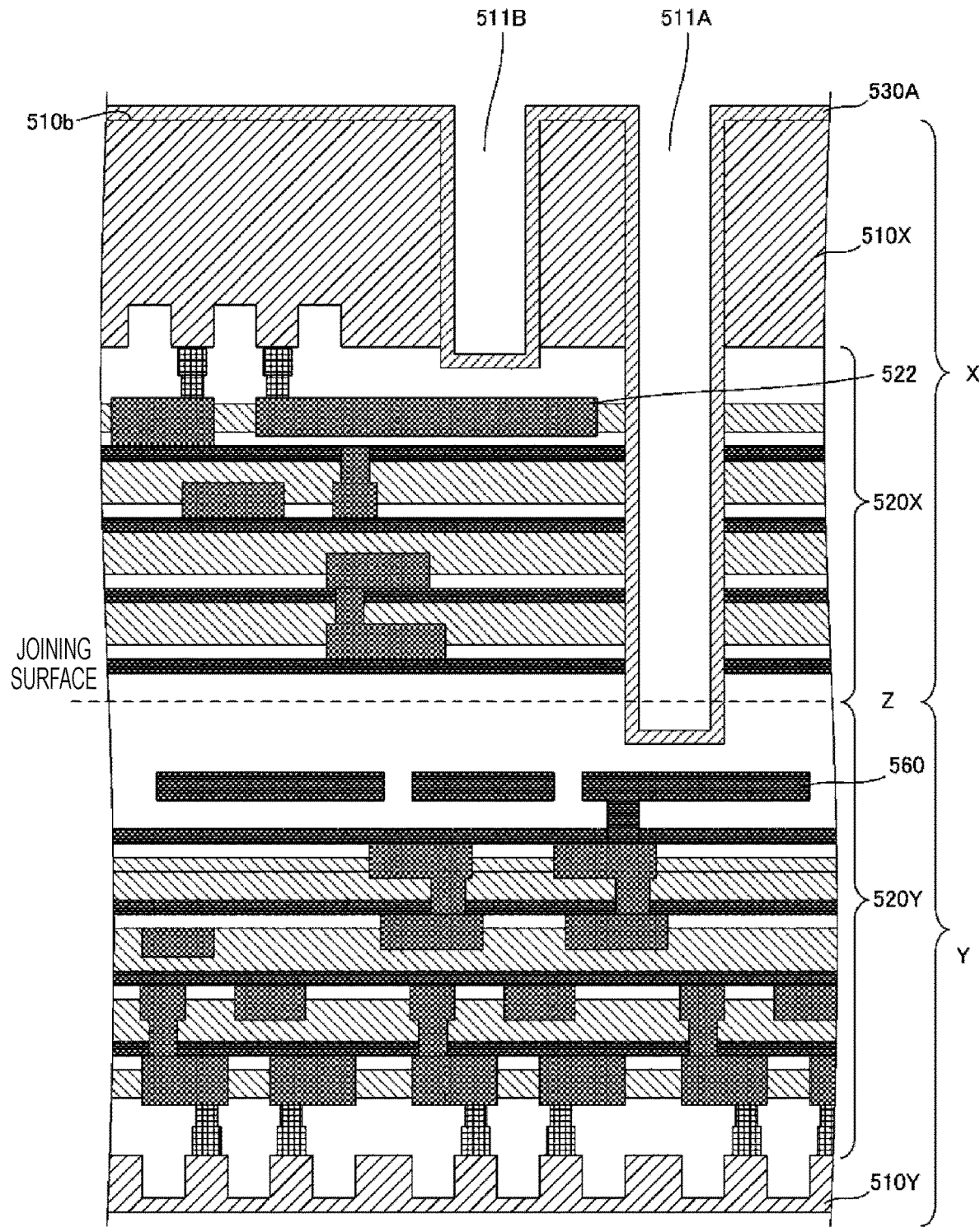
FIG. 18 is a diagram schematically illustrating a method for manufacturing a main portion of the semiconductor device according to the fifth embodiment.

Next, an insulating film 530A with high coverage is formed over the entire surface of the back surface 510b of the semiconductor substrate 510X, the entire inner side surface of the through hole 511A, and the entire inner surface of the through hole 511B (FIG. 18). The insulating film 530A is formed using the similar material and manufacturing method as the insulating film 30A of the first embodiment.

Figure 19:
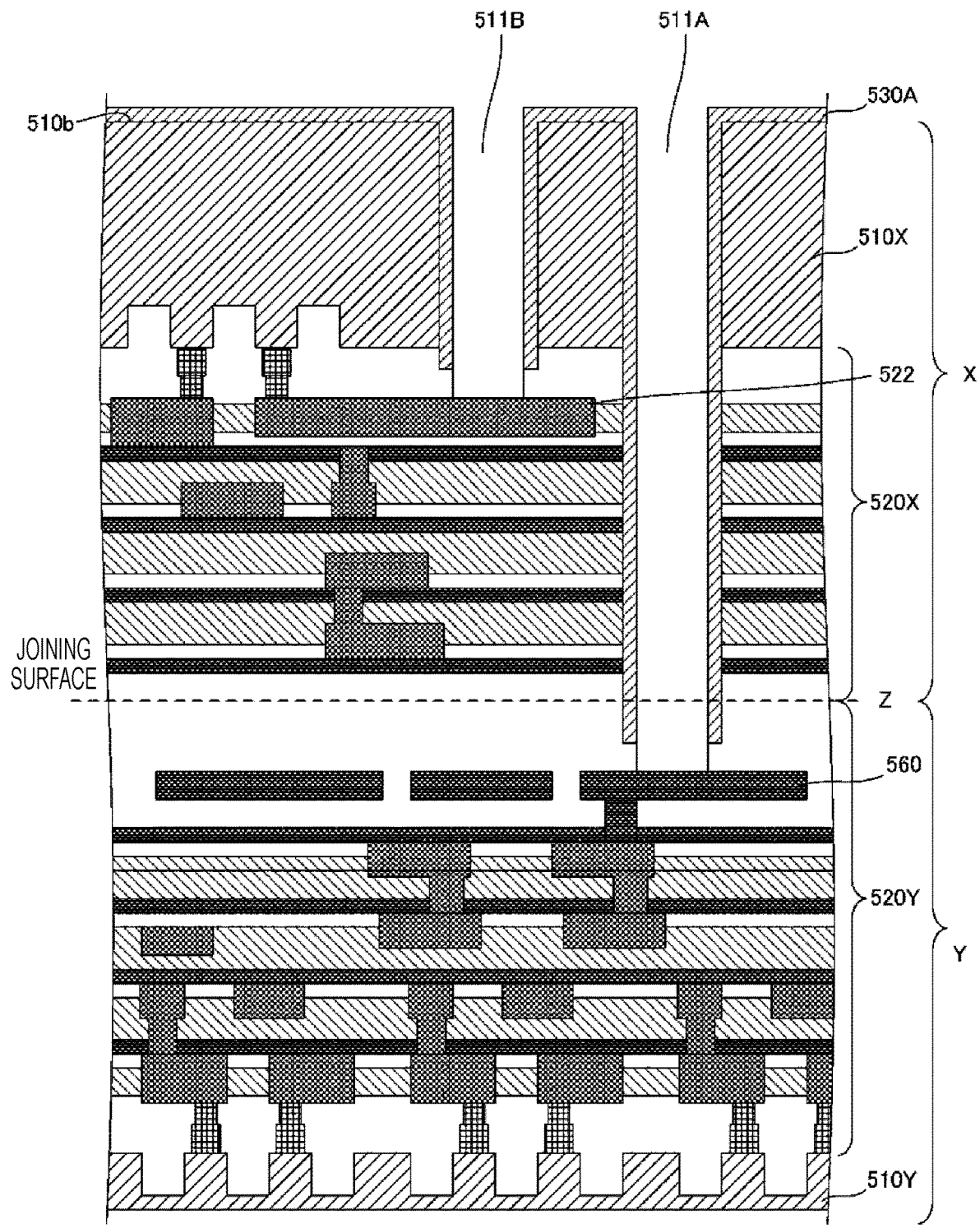
FIG. 19 is a diagram schematically illustrating a method of manufacturing a main portion of the semiconductor device according to the fifth embodiment.

Thereafter, the inner bottom surfaces of the through hole 511A and the through hole 511B are engraved by the method similar to the method of engraving the inner bottom surface of the through hole 11A of the first embodiment (FIG. 19). In the present embodiment, the through hole 511B is engraved toward the metal film 522 constituting the wiring layer 520X of the first element X, while the through hole 511A is engraved toward the metal electrode pad 560 constituting the wiring layer 520Y of the second element Y. Note that it is desirable that the engraving of the inner bottom surface of the through hole 511A and the engraving of the inner bottom surface of the through hole 511B be completed almost at the same time. For example, at formation of the through hole 511A and the through hole 511B, the depths of the through hole 511A and the through hole 511B are formed so that the distance between the inner bottom surface of the through hole 511B and the metal film 522 is substantially equal to the distance between the inner bottom surface of the through hole 511A and the metal electrode pad 560.

Figure 20:
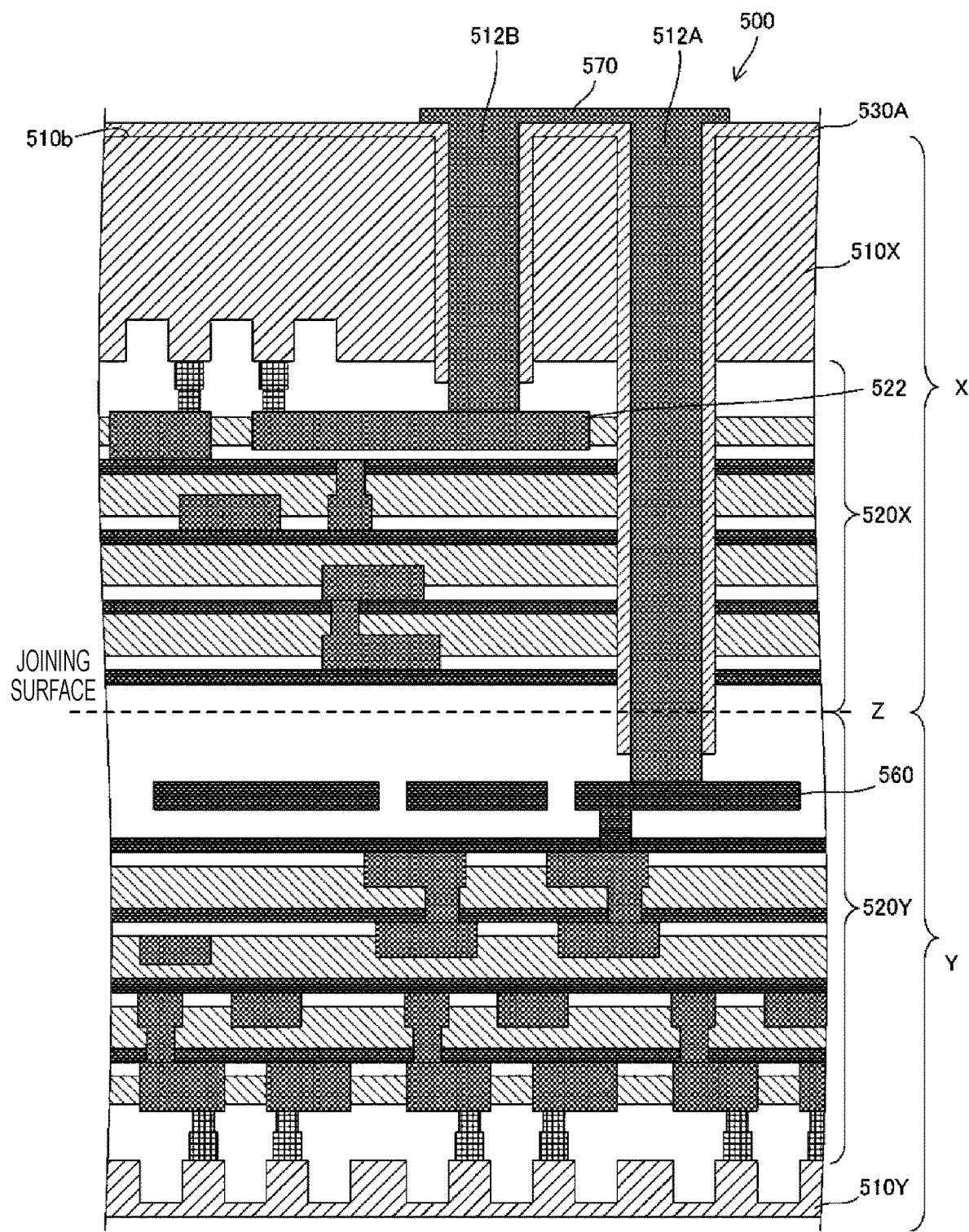
FIG. 20 is a diagram schematically illustrating a method of manufacturing a main portion of the semiconductor device according to the fifth embodiment.

Subsequently, similarly to the through hole 11 of the first embodiment, a barrier metal film (not illustrated) and a metal are buried in the through hole 511A and the through hole 511B respectively penetrating the metal electrode pad 560 and the metal film 522 so as to form through-substrate electrodes 512A and 512B (FIG. 20). The through-substrate electrode 512A and the through-substrate electrode 512B are electrically connected to each other by a metal film 570 formed along the back surface 510b of the semiconductor substrate 510X.

As described above, with the manufacturing method of the semiconductor device 500 according to the present embodiment, it is possible to form the through hole 511A and the through hole 511B penetrating the wiring layer 520 in parallel in processing performed in the same plasma apparatus without using a lithography technology. In addition, processing of the bottoms of the through hole 511A and the through hole 511B is stabilized. Furthermore, since the carbon-containing thin film 50 is easy to remove, the influence on the subsequent process can be minimized.

(F) Sixth Embodiment

Next, a semiconductor device 600 according to a sixth embodiment and a method of manufacturing the same will be described. The semiconductor device 600 is formed by stacking lamination of a plurality of elements including a wiring layer or the like on a semiconductor substrate, and is an example in which a through-substrate electrode penetrating through at least one element to be connected to an electrode of another element is connected to another electrode in the middle via side contact.

Figure 21:
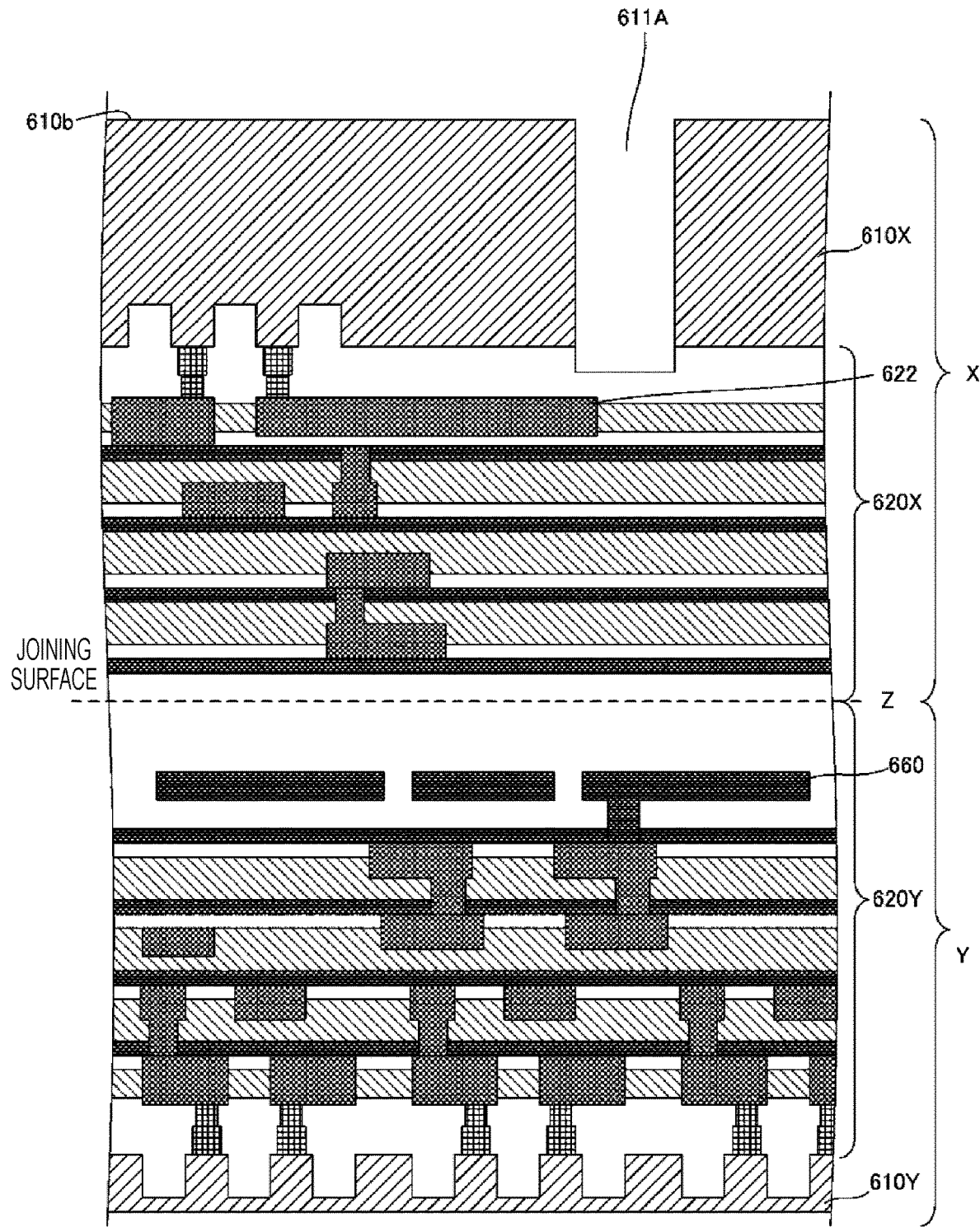
FIG. 21 is a diagram schematically illustrating a method of manufacturing a main portion of a semiconductor device according to a sixth embodiment.
Figure 22:
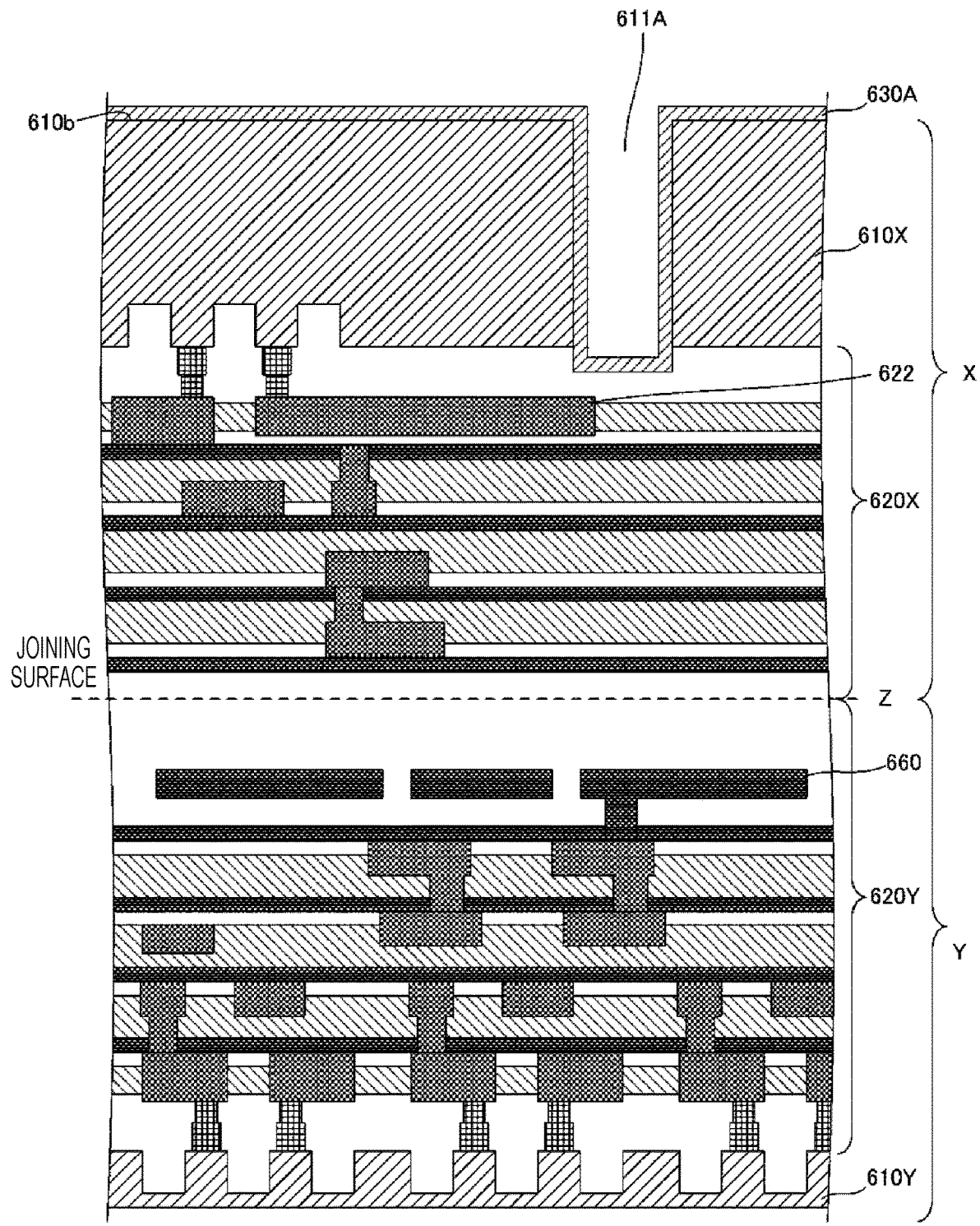
FIG. 22 is a diagram schematically illustrating a method of manufacturing a main portion of the semiconductor device according to the sixth embodiment.
Figure 23:
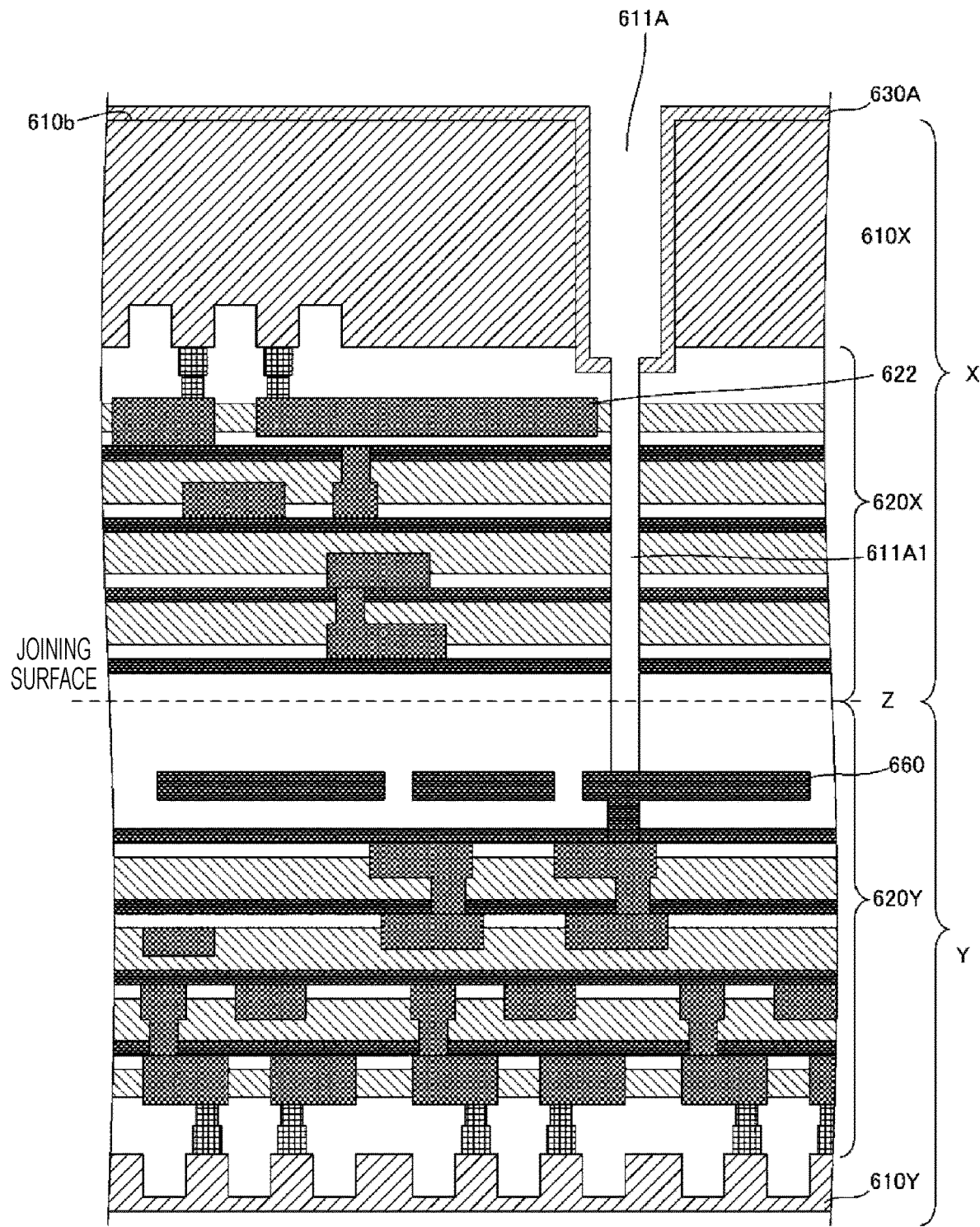
FIG. 23 is a diagram schematically illustrating a method of manufacturing a main portion of the semiconductor device according to the sixth embodiment.

FIGS. 21 to 23 are diagrams schematically illustrating a method of manufacturing a main portion of the semiconductor device 600 according to the present embodiment.

As illustrated in FIGS. 21 to 23, similarly to the semiconductor device 500 according to the fifth embodiment, the semiconductor device 600 is formed by adding processing to be described later to a combination obtained by joining the first element X and the second element Y by lamination.

First, a through hole 611A is formed in the semiconductor device 600 (FIG. 21). The through hole 611A is formed to penetrate through a semiconductor substrate 610X and having a depth not reaching a metal film 622 as a connection target of a wiring layer 620X of the first element X. Note that the through hole 611A and the metal film 622 overlap each other in plan view from the back surface 610b side of the semiconductor substrate 610X, indicating that there is a positional relationship such that the end portion of the through hole 611A partially overlaps the end portion of the metal film 622.

Next, an insulating film 630A with high coverage is stacked over the entire surface including the back surface 610b of the semiconductor substrate 610X and the inner surface of the through hole 611A (FIG. 22). The insulating film 630A is formed by the material and manufacturing method similar to those of the insulating film 30A of the first embodiment.

Thereafter, the first engraving is performed on the inner bottom surface of the through hole 611A (FIG. 23) by the method substantially similar to the method of engraving the inner bottom surface of the through hole 11A of the first embodiment. In the present embodiment, the through hole 611A is engraved toward the metal electrode pad 660 constituting a wiring layer 620Y of the second element Y.

However, a first engraving hole 611A1 formed in first engraving is formed by simply engraving a portion of the inner bottom surface of the through hole 611A. Specifically, the first engraving hole 611A1 is formed by engraving a range not interfering with the metal film 622 in a plan view from the back surface 610b side of the semiconductor substrate 610X. Therefore, the first engraving hole 611A1 reaches the metal electrode pad 660 with no exposure of the metal film 622 in the middle.

Figure 24:
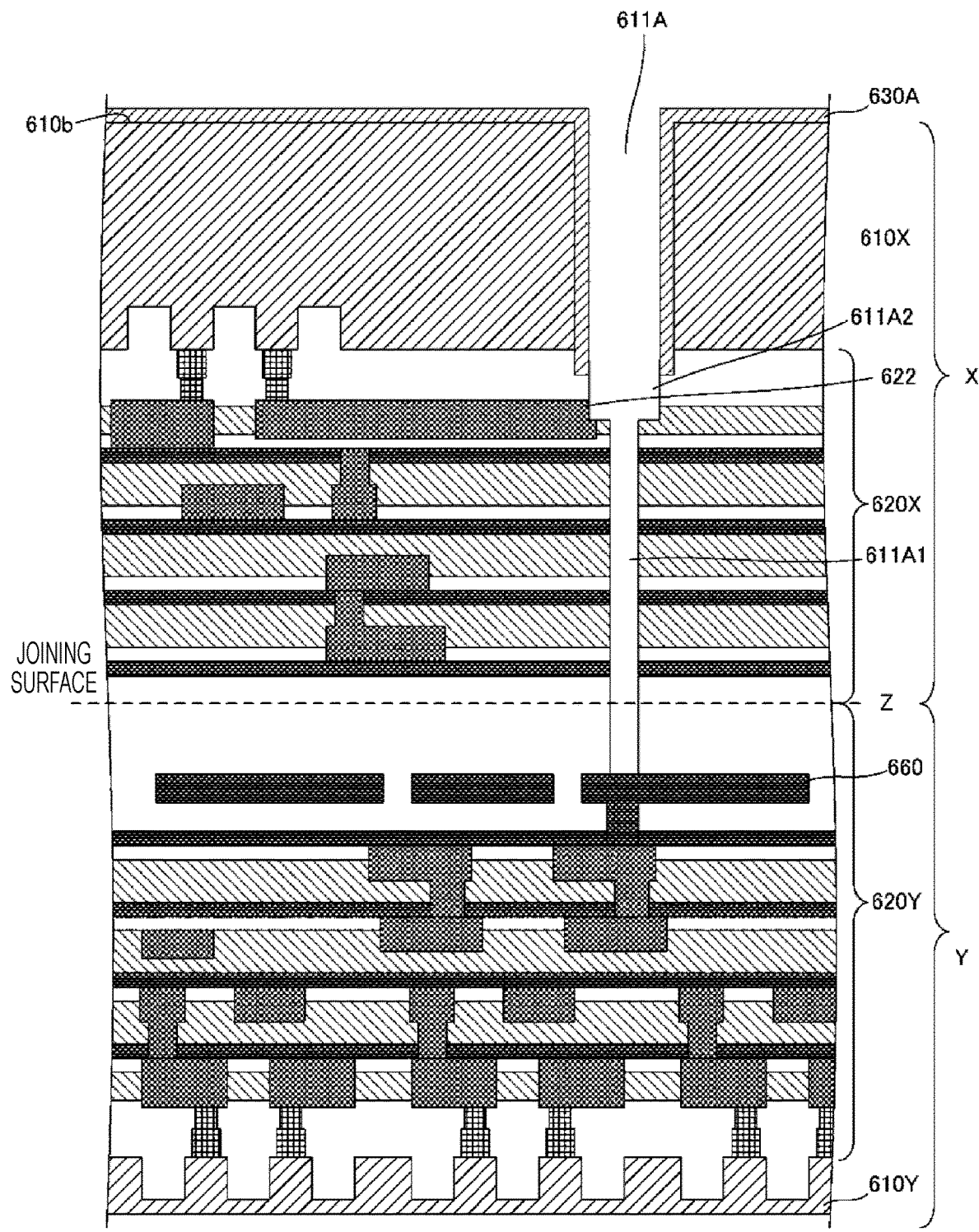
FIG. 24 is a diagram schematically illustrating a method of manufacturing a main portion of the semiconductor device according to the sixth embodiment.

After completion of the formation of the first engraving hole 611A1 in this manner, second engraving of engraving another inner bottom surface of the through hole 611A is performed to form a second engraving hole 611A2 having a depth to reach the metal film 622 (FIG. 24). The second engraving can also be defined as engraving to expand the first engraving hole 611A1 to a depth to reach the metal film 622. This process exposes the metal film 622 in the middle of the second engraving hole 611A2 (the side surface of the lower end portion and the corner portion of the bottom surface).

Figure 25:
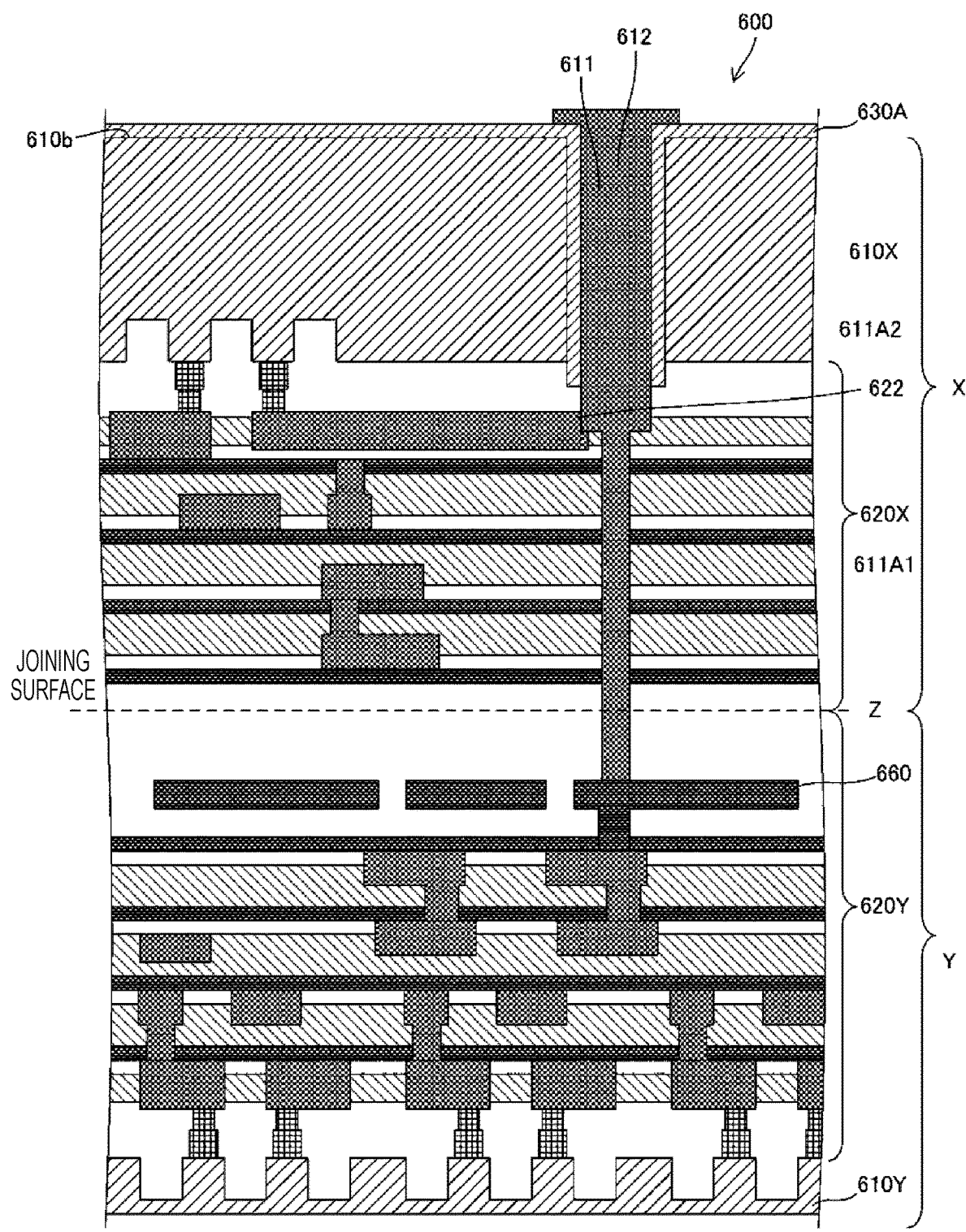
FIG. 25 is a diagram schematically illustrating a method of manufacturing a main portion of the semiconductor device according to the sixth embodiment.

For the through hole 611 thus formed, similarly to the through hole 11 of the first embodiment, a through-substrate electrode 612 is formed by burying a barrier metal film and a metal (not illustrated) inside the insulating film 630 formed in the through hole 611 (FIG. 25). The through-substrate electrode 612 is connected to the metal electrode pad 660 at the inner end thereof and comes in side contact with the metal film 622 on the way. This makes it possible to form the through hole 611 that penetrates through the wiring layer 620X and in which both the metal electrode pad 660 and the metal film 622 are exposed in the hole by the processing performed in the same plasma apparatus without using a lithography technology. In addition, processing of the bottom of the through hole 611A is stabilized. Furthermore, since the carbon-containing thin film 50 is easy to remove, the influence on the subsequent process can be minimized.

Here, a difference between the first engraving and the second engraving will be described with reference to FIGS. 26A-28B. Diagrams illustrated in FIGS. 26A-28B correspond to the engraving method in which processing including: plasma deposition of the carbon-containing thin film 50; the plasma etching using the carbon-containing thin film 50 as a mask; and ashing of removing the carbon-containing thin film 50 and the C polymer adhered during etching is repeated in a short cycle, and these diagrams simply illustrate the main points of the manufacturing method of the present embodiment, similar to the first embodiment.

Figure 26A:
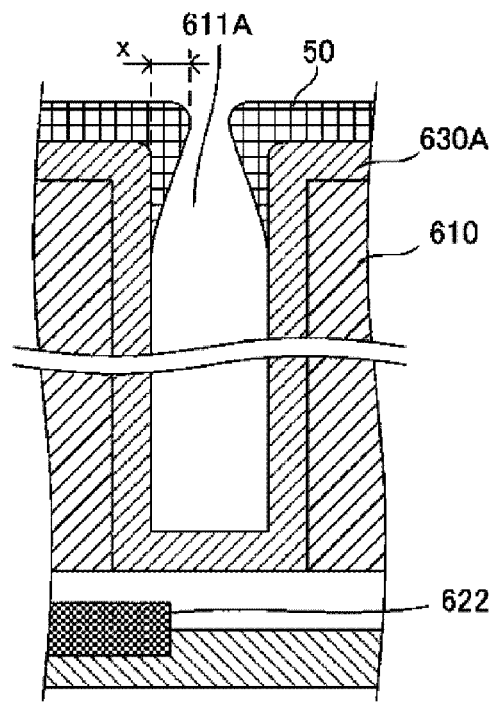
FIG. 26A is a diagram illustrating a difference between a first engraving and a second engraving.

First, at the time of forming the first engraving hole 611A1, the low coverage carbon-containing thin film 50 is formed to be thick so as to set the protrusion amount x which protrudes toward the center of the through hole 611A near the opening of the through hole 611A to a large amount (FIG. 26A). With this setting, the opening size of the through hole 611A is narrowed to a size substantially equal to the hole width of the first engraving hole 611A1.

Figure 26B:
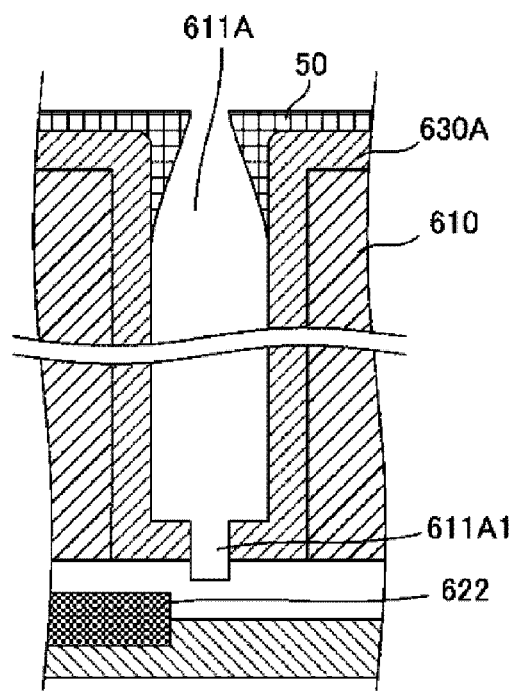
FIG. 26B is a diagram illustrating a difference between the first engraving and the second engraving.

When anisotropic plasma etching using the carbon-containing thin film 50 as a mask is performed in this state, the inner bottom surface of the through hole 611A is etched to be substantially the same size as the opening of the narrowed through hole 611A (FIG. 26B). Thereafter, processing of plasma deposition, plasma etching, and ashing is repeatedly performed in a short cycle so as to form the first engraving hole 611A1 (FIG. 27A) to a depth to reach the metal electrode pad 660 (not illustrated in FIGS. 26A- 28B).

Figure 27A:
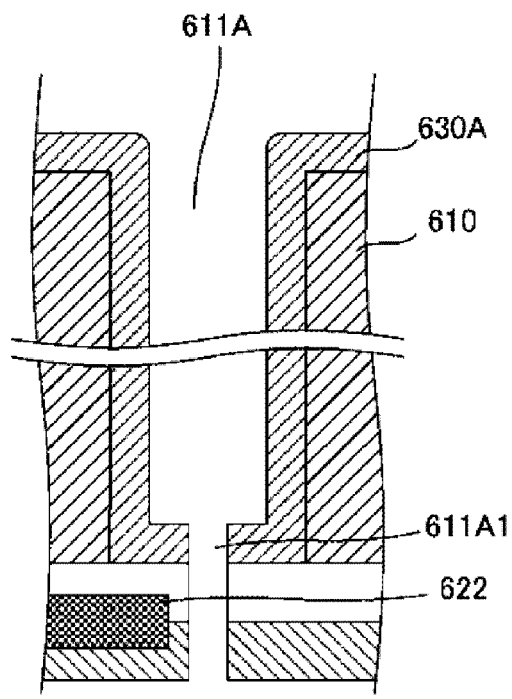
FIG. 27A is a diagram illustrating a difference between the first engraving and the second engraving.
Figure 27B:
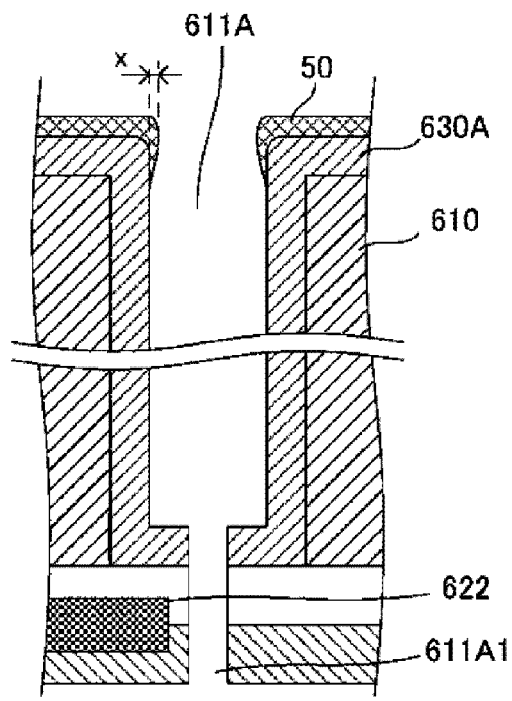
FIG. 27B is a diagram illustrating a difference between the first engraving and the second engraving.

Next, at the time of forming the second engraving hole 611A2, the low coverage carbon-containing thin film 50 is formed to be thin so as to set the protrusion amount x which protrudes toward the center of the through hole 611A near the opening of the through hole 611A to a small amount (FIG. 27B). With this setting, the opening size of the through hole 611A is maintained to a size substantially equal to the inner bottom surface of the through hole 611A.

Figure 28A:
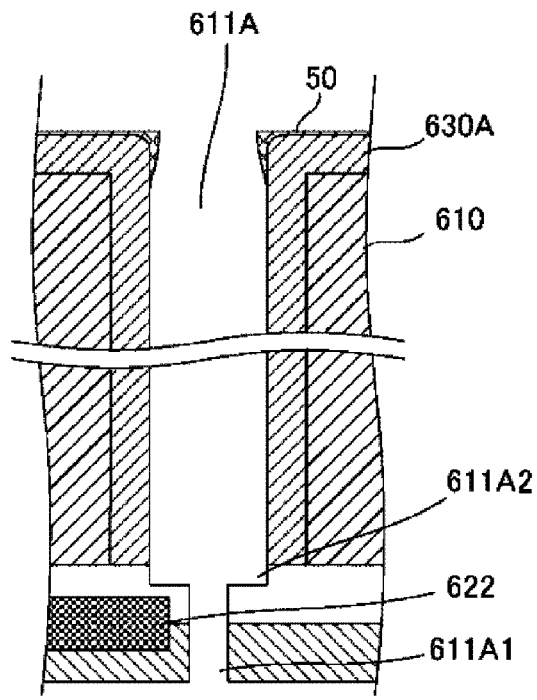
FIG. 28A is a diagram illustrating a difference between the first engraving and the second engraving.
Figure 28B:
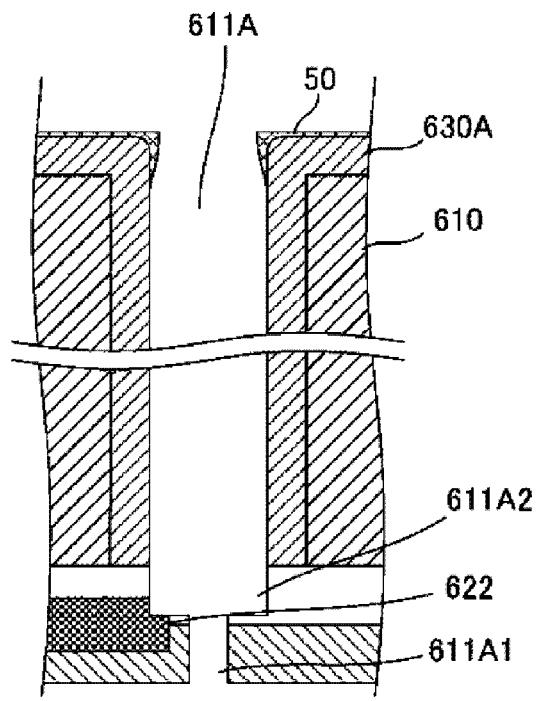
FIG. 28B is a diagram illustrating a difference between the first engraving and the second engraving.

When anisotropic plasma etching using the carbon-containing thin film 50 as a mask is performed in this state, a range of substantially the same size as the opening of the through hole 611A, that is, a substantially entire range of the inner bottom surface of the through hole 611A is etched (FIG. 28A). Thereafter, processing of the plasma deposition, plasma etching, and ashing is repeated in a short cycle, so as to form the second engraving hole 611A2 to a depth to reach the metal film 622 (FIG. 28B).

In this manner, by adjusting the thickness of the carbon-containing thin film 50 and adjusting the protrusion amount x protruding toward the center of the through hole 611A near the opening of the through hole 611A, it is possible to adjust the width of the engraving hole to be formed on the inner bottom surface of the through hole 611A. Therefore, in a case where there is an object to be avoided in a layer being engraved, the carbon-containing thin film 50 can be formed to be thick so that the engraving hole is narrowed to form a small-width engraving hole, making it easy to form the engraving hole while avoiding the through-substrate electrode and the object in the through hole 611. Furthermore, the metal film 622 to be connected to the through-substrate electrode formed in the middle of the engraving hole can be managed as follows. That is, while controlling to narrow the hole width so as not to interfere with the metal film 622 during engraving toward the metal electrode pad 660 at a deep position, and after completion of engraving into the metal electrode pad 660, the second engraving is performed by controlling the hole width to be wider so as to expose the metal film 622 at a shallow position again. This method can improve processing stability of the first engraving.

Note that the present technology is not limited to each of the above-described embodiments and modifications and includes configurations including mutual replacement or various modifications of combinations of individual formations disclosed in the above embodiments and modifications, configurations including mutual replacement or various modifications of combinations of individual formations disclosed in known technologies and the above embodiments and modifications, or the like. Furthermore, the technical scope of the present technology is not limited to the above-described embodiments, but extends to matters described in the claims and their equivalents.

Moreover, the present technology may also be configured as below.

(1)

A semiconductor device manufacturing method including:

a first step of forming a through hole in a semiconductor substrate by using anisotropic etching performed from a first surface side of the semiconductor substrate;

a second step of forming a thin film being an insulating film on an entire inner surface of the through hole;

a third step of forming a carbon-containing thin film using plasma deposition on the first surface including an opening edge portion of the through hole;

a fourth step of engraving an inner bottom of the through hole by using anisotropic plasma etching with the carbon-containing thin film as a mask;

a fifth step of removing the carbon-containing thin film by ashing; and a sixth step of forming a through-substrate electrode in the through hole.

(2)

The semiconductor device manufacturing method according to (1), in which the carbon-containing thin film is formed by plasma deposition using at least one of hydrocarbon, fluorocarbon, or hydrofluorocarbon, as a process gas.

(3)

The semiconductor device manufacturing method according to (1) or (2), in which the anisotropic plasma etching in the fourth step is performed by plasma etching using at least one of a fluorocarbon or a hydrofluorocarbon, as a process gas.

(4)

The semiconductor device manufacturing method according to any one of (1) to (3), in which the carbon-containing thin film is formed in a shape such that the vicinity of an opening of the through hole protrudes toward a center of the through hole.

(5)

The semiconductor device manufacturing method according to any one of (1) to (4), in which an additional insulating film covering at least a portion of the thin film being an insulating film formed in the vicinity of the opening of the through hole is formed before the sixth step.

(6) A semiconductor device including:
a semiconductor substrate;
a wiring layer formed to be stacked on a first surface of the semiconductor substrate;
a metal film constituting a portion of the wiring layer;
a first insulating film constituting a portion of the wiring layer and provided adjacent to the semiconductor substrate side of the metal film;
a through-substrate electrode penetrating from the first surface of the semiconductor substrate and from a second surface of the semiconductor substrate opposite to the first surface, to the metal film;
a second insulating film interposed between the through-substrate electrode and the semiconductor substrate; and
a third insulating film formed to adhere to a second surface-side end portion of the second insulating film.

REFERENCE SIGNS LIST

10 Semiconductor substrate
10a Front surface
10b Back surface
11 Through hole
11A Through hole
12 Through-substrate electrode
20 Wiring layer
21 Insulating film
22 Metal film
30 Insulating film
30A Insulating film
31 Insulating film main body
32 Additional insulating film
32A Additional insulating film
40 Resist
41 Opening
50 Carbon-containing thin film
100 Semiconductor device
200 Semiconductor device
300 Semiconductor device
400 Semiconductor device
410 Semiconductor substrate
410a Front surface
410b Back surface
411 Through hole
411A Through hole
412 Through-substrate electrode
420 Wiring layer
430 Insulating film
430A Insulating film
460 Metal electrode pad
500 Semiconductor device
510X Semiconductor substrate
510Y Semiconductor substrate
510b Back surface
511A Through hole
511B Through hole
512 Through-substrate electrode
520 Wiring layer
520X Wiring layer
520Y Wiring layer
522 Metal film
530 Insulating film
530A Insulating film
560 Metal electrode pad
600 Semiconductor device
610X Semiconductor substrate
610b Back surface
611 Through hole
611A Through hole
611A1 First engraving hole
611A2 Second engraving hole
612 Through-substrate electrode
620X Wiring layer
620Y Wiring layer
622 Metal film
630 Insulating film
630A Insulating film
660 Metal electrode pad
X First element
Y Second element
Z Joining surface

What is claimed is:

1. A semiconductor device manufacturing method comprising:
a first step of forming a through hole in a semiconductor substrate by using anisotropic etching performed from a first surface side of the semiconductor substrate;
a second step of forming an insulating film on an entire inner surface of the through hole;
a third step of forming a carbon-containing film using plasma deposition of at least one of hydrocarbon, fluorocarbon, and hydrofluorocarbon as process gas, on the first surface including an opening edge portion of the through hole;
a fourth step of engraving an inner bottom of the through hole by using anisotropic plasma etching with the carbon-containing film as a mask;
a fifth step of removing the carbon-containing film by ashing; and
a sixth step of forming a through-substrate electrode in the through hole.

2. The semiconductor device manufacturing method according to claim 1,
wherein the anisotropic plasma etching in the fourth step is performed by plasma etching using at least one fluorocarbon and hydrofluorocarbon as a process gas.

3. The semiconductor device manufacturing method according to claim 1,
wherein the carbon-containing film is formed in a shape such that a portion of the carbon-containing film protrudes from the inner surface of the through hole toward a center of the through hole.

4. The semiconductor device manufacturing method according to claim 1, further comprising forming a second insulating film before the sixth step, wherein the second insulating film covers at least a portion of the insulating film in a vicinity of the through hole.

* * * * *